(12) United States Patent
Hori et al.

(10) Patent No.: US 9,343,655 B2
(45) Date of Patent: May 17, 2016

(54) METHOD FOR MANUFACTURING BIMORPH ACTUATOR

(75) Inventors: Hisao Hori, Miyagi (JP); Yoshikazu Abe, Miyagi (JP); Yoshihiro Sato, Miyagi (JP)

(73) Assignee: ADVANTEST CORPORATION, Tokyo (JP)

( * ) Notice: Subject to any disclaimer, the term of this patent is extended or adjusted under 35 U.S.C. 154(b) by 1005 days.

(21) Appl. No.: 13/279,331

(22) Filed: Oct. 24, 2011

(65) Prior Publication Data

US 2013/0026021 A1    Jan. 31, 2013

(30) Foreign Application Priority Data

Jul. 26, 2011    (JP) .................................. 2011-163277

(51) Int. Cl.
*H01L 41/09*    (2006.01)
*H01L 41/22*    (2013.01)
*H01L 41/331*    (2013.01)
(Continued)

(52) U.S. Cl.
CPC .............. *H01L 41/331* (2013.01); *H01H 49/00* (2013.01); *H01H 57/00* (2013.01); *H01L 41/0478* (2013.01); *H01L 41/0815* (2013.01); *H01L 41/094* (2013.01); *H01L 41/22* (2013.01); *H01L 41/29* (2013.01); *H01L 41/318* (2013.01); *H01L 41/332* (2013.01); *H01H 2057/006* (2013.01); *H03H 9/568* (2013.01); *H03H 9/584* (2013.01); *H03H 9/585* (2013.01); *H03H 9/605* (2013.01); *Y10T 29/42* (2015.01);
(Continued)

(58) Field of Classification Search
CPC . H01H 49/00; H01H 57/00; H01H 2057/006; H01L 41/0478; H01L 41/0815; H01L 41/094; H01L 41/29; H01L 41/318; H01L 41/331; H01L 41/332; H01L 41/22; H03H 9/568; H03H 9/584; H03H 9/585; H03H 9/605; Y10T 29/42; Y10T 29/49005; Y10T 29/49147; Y10T 29/49155
USPC .................. 29/25.35, 594, 842, 846; 427/100; 310/321, 330, 332, 348, 365
See application file for complete search history.

(56) References Cited

U.S. PATENT DOCUMENTS 6,711,793 B2 *    3/2004    Sumi ............................ 29/25.35
7,424,772 B2 *    9/2008    Larson, III .................... 29/25.35
(Continued)

FOREIGN PATENT DOCUMENTS

JP    2000-299513 A    10/2000
JP    2001-191300 A     7/2001
(Continued)

OTHER PUBLICATIONS

Office Action for Japanese Patent Application No. 2011-163277, issued by the Japanese Patent Office on Jul. 9, 2013.

*Primary Examiner* — A. Dexter Tugbang

(57) ABSTRACT

To manufacture a switching apparatus that includes a piezoelectric actuator with increased lifespan, provided is a method for manufacturing a bimorph actuator, comprising first piezoelectric element layer formation of forming a first piezoelectric element layer on a substrate; support layer formation of forming a support layer made of an insulator on the first piezoelectric element layer; second piezoelectric element layer formation of forming a second piezoelectric element layer on the support layer; and removal of removing a portion of the substrate to form an actuator that includes the first piezoelectric element layer, the support layer, and the second piezoelectric element layer.

12 Claims, 18 Drawing Sheets

(51) Int. Cl.
   *H01L 41/08*   (2006.01)
   *H01H 49/00*   (2006.01)
   *H01H 57/00*   (2006.01)
   *H01L 41/047*  (2006.01)
   *H01L 41/29*   (2013.01)
   *H01L 41/318*  (2013.01)
   *H01L 41/332*  (2013.01)
   *H03H 9/56*    (2006.01)
   *H03H 9/58*    (2006.01)
   *H03H 9/60*    (2006.01)
(52) U.S. Cl.
   CPC ..... *Y10T 29/49005* (2015.01); *Y10T 29/49147* (2015.01); *Y10T 29/49155* (2015.01)

(56) References Cited

U.S. PATENT DOCUMENTS 7,520,038 B2 * 4/2009 Li ................................. 29/25.35
2009/0261922 A1 * 10/2009 Umeda ..................... 310/321 X

FOREIGN PATENT DOCUMENTS

| JP | 2002-9359 A    |   | 1/2002  |
|----|----------------|---|---------|
| JP | 2008022408 A   | * | 1/2008  |
| JP | 2009-65513 A   |   | 3/2009  |
| JP | 2009-226728 A  |   | 10/2009 |

* cited by examiner

500

METHOD FOR MANUFACTURING BIMORPH ACTUATOR

BACKGROUND

1. Technical Field

The present invention relates to an actuator manufacturing method, a switching apparatus, a transmission line switching apparatus, and a test apparatus.

2. Related Art

An actuator is known that includes piezoelectric film and electrodes applying voltage to the piezoelectric film, and operates according to expansion and contraction of the piezoelectric film by applying voltage thereto, as shown in Patent Document 1, for example.

Patent Document 1: Japanese Patent Application Publication No. 2001-191300

However, when the actuator is used as a switch that causes contact points to contact each other or move away from each other by causing the piezoelectric film to expand or contract, the contact points can get stuck together and be unable to move away from each other. Furthermore, this actuator is formed by layering different types of material, and therefore the stress of the piezoelectric film, for example, causes bowing of the actuator even when in an initial state with no voltage applied. Yet further, the lifespan of the piezoelectric film is shortened from repeated expansion and contraction.

SUMMARY

Therefore, it is an object of an aspect of the innovations herein to provide an actuator manufacturing method, a switching apparatus, a transmission line switching apparatus, and a test apparatus, which are capable of overcoming the above drawbacks accompanying the related art. The above and other objects can be achieved by combinations described in the independent claims. The dependent claims define further advantageous and exemplary combinations of the innovations herein. According to a first aspect related to the innovations herein, provided is a method for manufacturing a bimorph actuator, comprising first piezoelectric element layer formation of forming a first piezoelectric element layer on a substrate; support layer formation of forming a support layer made of an insulator on the first piezoelectric element layer; second piezoelectric element layer formation of forming a second piezoelectric element layer on the support layer; and removal of removing a portion of the substrate to form an actuator that includes the first piezoelectric element layer, the support layer, and the second piezoelectric element layer.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
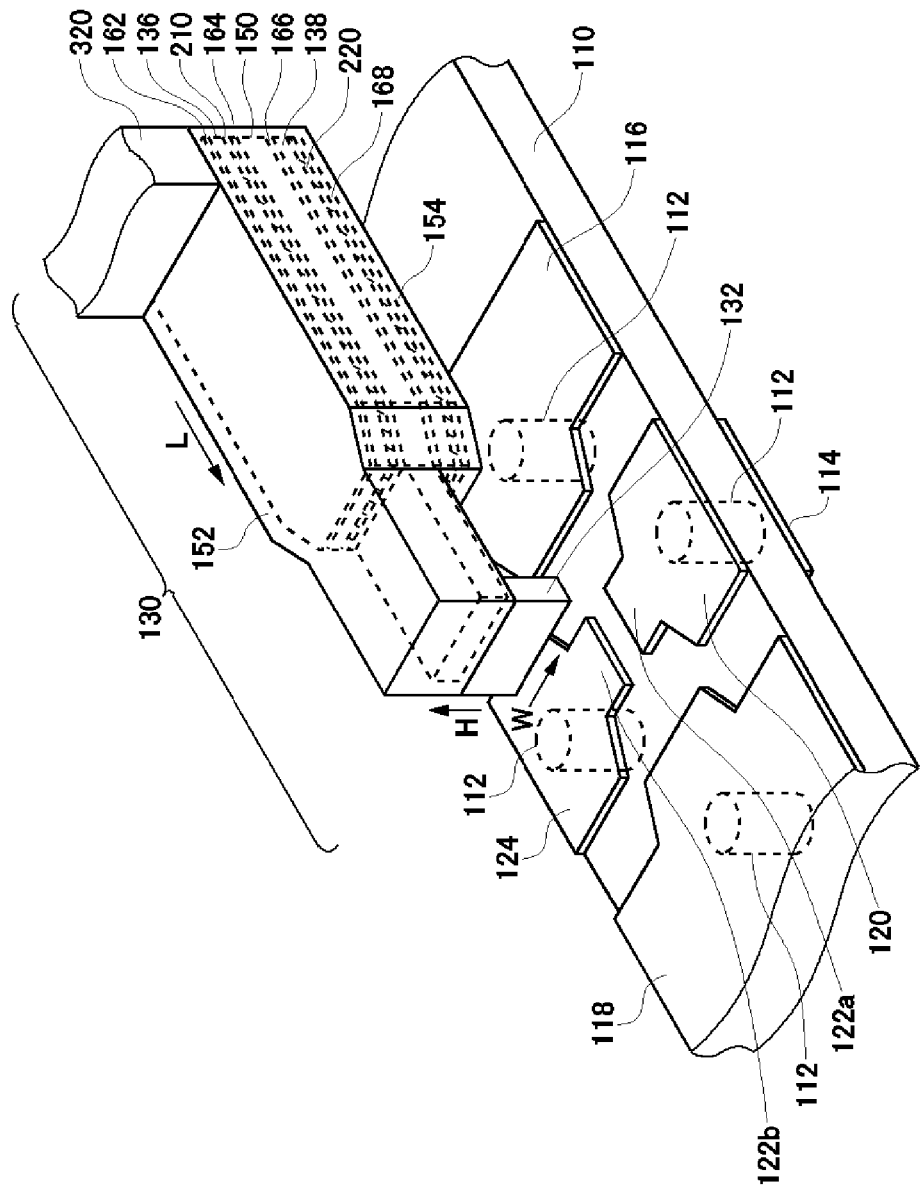
FIG. 1 shows an exemplary configuration of a switching apparatus 100 according to an embodiment of the present invention.
Figure 2:
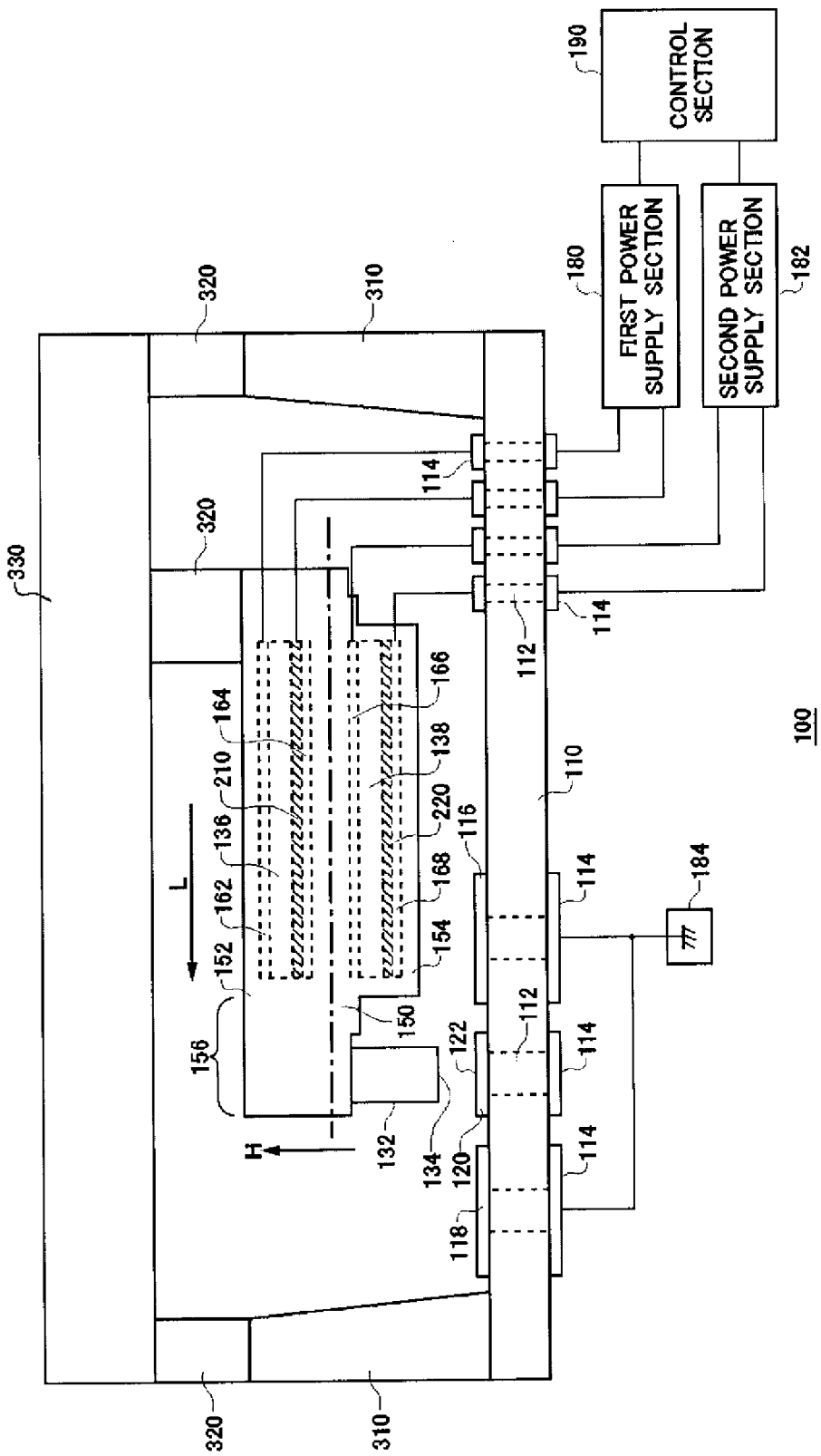
FIG. 2 shows a side view of the switching apparatus 100 according to the present embodiment.

FIG. 1 shows an exemplary configuration of a switching apparatus 100 according to an embodiment of the present invention. FIG. 2 shows a side view of the switching apparatus 100 according to the present embodiment. The switching apparatus 100 includes conductive oxide films between piezoelectric films and electrodes applying voltage to the piezoelectric films, and increases the lifespan of the piezoelectric films. Furthermore, the switching apparatus 100 prevents physical damage to the actuator 130 such as cracking, chipping, or fracturing, while increasing the rigidity of the actuator 130.

The switching apparatus 100 causes first contact points 122, which are fixed contact points formed on the lower substrate section, and a second contact point 134, which is a movable contact point formed on the actuator, to be in contact with each other or move away from each other, thereby switching the fixed contact points and the movable contact point between an electrically conductive state and a non-conductive state. The switching apparatus 100 may be housed and sealed in a package, for example. The switching apparatus 100 includes a lower substrate section 110, an actuator 130, a first power supply section 180, a second power supply section 182, a reference voltage 184, a control section 190, a cavity section 310, a base portion 320, and an upper substrate section 330.

The lower substrate section 110 includes a flat first surface on which the fixed contact point is disposed. The lower substrate section 110 may include wiring sections for exchanging electrical signals or power, for example, with the outside, disposed on a second surface that is different from the first surface. The lower substrate section 110 may be an insulator such as a glass substrate, or may be a semiconductor substrate made of silicon, for example. The lower substrate section 110 includes vias 112, wiring sections 114, a ground line 116, a ground line 118, a first signal line 120, a first contact point 122a, a first contact point 122b, and a second signal line 124.

The vias 112 penetrate through the lower substrate section 110 and are coated with metal to provide an electrical connection between the electrical wiring formed on the first surface and the electrical wiring formed on the second surface. For example, a via 112 may provide an electrical connection between the first contact point 122 and a wiring section 114 formed on the second surface. The vias 112 may be filled with a conductive material to keep through-holes formed between the top surface and the bottom surface of the lower substrate section 110 in a sealed state. A plurality of vias 112 may be provided to the lower substrate section 110, such that the number of vias 112 corresponds to the number of electrical signals or power supplies supplied to the actuator 130 and the number of first contact points 122 in the lower substrate section 110.

The wiring sections 114 transmit a signal passed through the switching apparatus 100, an electrical signal supplied to the actuator 130, or a power supply voltage, for example. The wiring sections 114 may be a wiring pattern provided on the first surface or second surface of the lower substrate section 110 to transmit or receive a signal to or from at least one via 112. Instead, the wiring sections 114 may be formed on a first surface or a second surface of the upper substrate section 330. The wiring sections 114 may include a land, a connector, and/or an antenna, and may transmit and receive signals passed through the switching apparatus 100 from the outside.

The ground line 116 and the ground line 118 are provided on the first surface of the lower substrate section 110, and are connected to the reference voltage 184 through vias 112 and wiring sections 114. The ground line 116 and the ground line 118 may be conductive wiring patterns.

The first signal line 120 and the second signal line 124 are formed on the first surface of the lower substrate section 110, between the ground line 116 and the ground line 118. The first signal line 120 and the second signal line 124 may be conductive wiring patterns.

The ground line 116, the ground line 118, the first signal line 120, and the second signal line 124 may form a coplanar transmission line. In other words, the line width of the first signal line 120 and the second signal line 124, the interval between the ground line 116 and the first signal line 120, the interval between the ground line 116 and the second signal line 124, the interval between the ground line 118 and the first signal line 120, and the interval between the ground line 118 and the second signal line 124 are formed to be predetermined values according to the characteristic impedance of the first signal line 120 and the second signal line 124. As a result, the first signal line 120 and the second signal line 124 can transmit signals with high frequencies up to tens of GHz.

If the electrical signals passed through the switching apparatus 100 have low enough frequencies to be transmitted without forming a coplanar transmission line, then the ground line 116 and the ground line 118 need not be included.

The first contact point 122a is provided on the first signal line 120, and the first contact point 122b is provided on the second signal line 124. The first contact points 122 may each be a flat surface without any protrusions. The first contact points 122 may include aluminum, tungsten, palladium, rhodium, gold, platinum, ruthenium, indium, iridium, osmium, molybdenum, and/or nickel. The first contact points 122 may be an alloy of two or more of the above materials. The first signal line 120 and the second signal line 124 may be formed of substantially the same material as the first contact points 122.

The actuator 130 includes a second contact point 134, and moves the second contact point 134 to contact or move away from the first contact points 122. The actuator 130 may be deposited by a semiconductor manufacturing apparatus using a sol-gel technique and CVD (Chemical Vapor Deposition). The actuator 130 includes a second contact point section 132, a first piezoelectric film 136, a second piezoelectric film 138, a support layer 150, a first protective film 152, a second protective film 154, a protruding section 156, a first electrode layer 162 and second electrode layer 164 of the first piezoelectric film 136, a third electrode layer 166 and a fourth electrode layer 168 of the second piezoelectric film 138, a first conductive oxide film 210, and a second conductive oxide film 220.

The second contact point section 132 includes the second contact point 134. The second contact point section 132 may include the same metal as the first contact points 122. The second contact point 134 may include a protrusion. Instead, the second contact point 134 may be a flat surface without a protrusion.

The second contact point 134 may be semispherical in order to prevent degradation or damage of the first contact points 122, or may have a tip shaped as a rounded needle. For example, the second contact point 134 may have a predetermined shape that, when the second contact point 134 contacts the first contact points 122 to form a transmission line, creates a transmission line having a width corresponding to the frequency of the signal being transmitted.

In the present embodiment, the switching apparatus 100 includes two first contact points 122a and 122b of the lower substrate section 110, and these contact points 122 are brought into contact with and moved away from one second contact point 134. In this way, the switching apparatus 100 can switch between an electrically conductive state and an electrically non-conductive state between the first contact point 122a and the first contact point 122b via the second contact point 134. A wiring section 114 transmits a signal from the outside to the first contact point 122a, and this signal is transmitted from the first contact point 122b to the outside when the switching apparatus 100 is ON, for example.

Instead, the switching apparatus 100 may include one first contact point 122 on the lower substrate section 110, and wiring that transmits an electrical signal from the outside to the second contact point 134 may be provided on the actuator 130. This wiring may transmit the electrical signal from the outside to a first contact point 122, receive the electrical signal via the second contact point 134, and transmit the electrical signal to the outside. In this way, the switching apparatus 100 can switch the signal transmission from the second contact point 134 to the first contact point 122 ON/OFF, and may transmit a signal, received from the outside, to the outside from the second contact point 134 via a first contact point 122 when the switching apparatus 100 is ON.

The first piezoelectric film 136 is formed on the top surface of the support layer 150. The first piezoelectric film 136 may expand and contract according to a first drive voltage. In this case, when the first drive voltage is applied, the first piezoelectric film 136 expands or contracts in the longitudinal direction of the actuator 130, thereby causing the actuator 130 to bend in a direction that changes the distance between the first contact points 122 and the second contact point 134.

The first piezoelectric film 136 may be formed of Perovskite ferroelectric substances such as barium titanate (BTO), lead lanthanum zirconate titanate (PLZT), Lead zirconate titanate (PZT), aluminum nitride (AlN), or a zinc oxide (ZnO) wurtzite crystal.

The second piezoelectric film 138 is provided on a different surface of the support layer 150 than the surface on which the first piezoelectric film 136 is formed, faces the first piezoelectric film 136 via the support layer 150, and expands and contracts according to a second drive voltage to change the bowing amount of the actuator 130. When the second drive voltage is applied, the second piezoelectric film 138 expands or contracts in the longitudinal direction of the actuator 130, thereby causing the actuator 130 to bend in a direction that changes the distance between the first contact points 122 and the second contact point 134.

The second piezoelectric film 138 may be formed using Perovskite ferroelectric substances, in the same manner as the first piezoelectric film 136. The second piezoelectric film 138 preferably uses substantially the same material and has substantially the same shape as the first piezoelectric film 136. Furthermore, the thickness of the first piezoelectric film 136 and the second piezoelectric film 138 may be within a range from 0.1 µm to 5 µm. If the first piezoelectric film 136 and the second piezoelectric film 138 are formed by depositing PZT, the deposition of the PZT may be performed after depositing lead titanate (PT). As a result, the PZT can be formed with good crystallinity.

The first piezoelectric film 136 restricts bowing of the actuator 130 when the second drive voltage is not applied to the second piezoelectric film 138. The first piezoelectric film 136 uses substantially the same material and has substantially the same shape as the second piezoelectric film 138, and is provided on the opposite surface of the actuator 130 from the second piezoelectric film 138. Therefore, the first piezoelectric film 136 exerts a stress that bows the actuator 130 in a direction opposite the bowing caused by the second piezoelectric film 138, thereby restricting the bowing of the actuator 130.

The first piezoelectric film 136 restricts bowing of the actuator 130 caused by expansion and contraction due to temperature change of the second piezoelectric film 138. The second piezoelectric film 138 is formed by layering films made of materials having different thermal expansion coefficients, and therefore the second piezoelectric film 138 deforms in response to thermal stress caused by temperature change, thereby causing bowing of the actuator 130. The first piezoelectric film 136 uses substantially the same material and has substantially the same shape as the second piezoelectric film 138, and is provided on the opposite surface of the actuator 130 from the second piezoelectric film 138. Therefore, the first piezoelectric film 136 exerts a stress that bows the actuator 130 in a direction opposite the bowing caused by the temperature change, thereby restricting the bowing of the actuator 130 due to temperature change.

The support layer 150 is provided between the first piezoelectric film 136 and the second piezoelectric film 138. The support layer 150 is elastic and deforms when force is applied thereto, so that the support layer 150 bends when the first piezoelectric film 136 and/or the second piezoelectric film 138 expands or contracts to exert a force on the support layer 150. The support layer 150 is rigid enough to prevent the actuator 130 from being bent too much, and to return the actuator 130 to the initial position when the application of the electric field of the first piezoelectric film 136 and the second piezoelectric film 138 is stopped.

When forming the first piezoelectric film 136 and/or the second piezoelectric film 138, the support layer 150 is heated to a firing temperature along with the piezoelectric films. In other words, the first piezoelectric film 136 and the second piezoelectric film 138 are heated to the firing temperature thereof to be formed on different surfaces of the support layer 150, and therefore the support layer 150 is heated to the firing temperature along with the first piezoelectric film 136 and/or the second piezoelectric film 138.

Therefore, the support layer 150 is made from a material that is not damaged when heated to the firing temperature of the first piezoelectric film 136 and/or the second piezoelectric film 138. If the first piezoelectric film 136 and the second piezoelectric film 138 are made of PZT, for example, the firing temperature can exceed 700° C. Accordingly, the support layer 150 is preferably made of a material that does not exhibit physical damage such as cracking, chipping, or fracturing when heated to the firing temperature of the first piezoelectric film 136 and/or the second piezoelectric film 138.

Furthermore, the support layer 150 is preferably made of a material that is unlikely to cause a chemical reaction with the piezoelectric films or the electrode layers when heated to the firing temperature of the first piezoelectric film 136 and the second piezoelectric film 138. The first support layer 150 is preferably made of a material that forms a compound with the piezoelectric films or the electrode layers as a result of being heated to the firing temperature of the piezoelectric films, and that does not exhibit physical damage such as cracking, chipping, or fracturing. In this case, the support layer 150 is preferably made of a material that does not degrade the film characteristics, such as the piezoelectric constant, of the first piezoelectric film 136 or the second piezoelectric film 138 when heated to the firing temperature of the piezoelectric films.

The support layer is formed of an insulating material. By using an insulating material, the support layer 150 can tolerate the firing temperature of the piezoelectric films at approximately 700° C. and can be formed in a short time using a method such as CVD that is less expensive than a metal film.

The support layer 150 may include silicon oxide (SiO$_2$) or silicon nitride (SiN). Instead, the support layer 150 may use a conductor such as aluminum, gold, or platinum, an insulator such as glass, or a semiconductor such as silicon. The thickness of the support layer 150 may be in a range from 0.1 μm to 50 μm.

The first protective film 152 is formed of an insulating material, covers at least a portion of the first piezoelectric film 136 from a side thereof that is opposite the support layer 150, and contacts the support layer 150 across at least a portion of the tip of the first piezoelectric film 136. The first protective film 152 and the support layer 150 may be formed to cover the first piezoelectric film 136, the first electrode layer 162, and the second electrode layer 164 such that these layers are not exposed. Here, the first protective film 152 and the support layer 150 may be formed to expose connecting sections that are used to connect the first electrode layer 162 and the second electrode layer 164 to the wiring sections 114.

The first protective film 152 and the support layer 150 may be formed to cover a portion of the first piezoelectric film 136, the first electrode layer 162, and the second electrode layer 164. For example, the first protective film 152 and the support layer 150 may cover a side portion of each layer. In other words, the first protective film 152 and the support layer 150 may cover a side portion of the actuator 130. The first protective film 152 and the support layer 150 may cover the support layer 150 side of the actuator 130.

The second protective film 154 is formed of an insulating material, covers at least a portion of the second piezoelectric film 138 from the side opposite the support layer 150, and contacts the support layer 150 at least at the end portion of the second piezoelectric film 138. The second protective film 154 and the support layer 150 may be formed to cover the second piezoelectric film 138, the fourth electrode layer 168, and the third electrode layer 166 such that none of these layers are exposed. The second protective film 154 and the support layer 150 may be formed to expose connecting portions that connect the wiring sections 114 to the first electrode layer 162, the second electrode layer 164, the fourth electrode layer 168, and the third electrode layer 166.

The second protective film 154 and the support layer 150 may be formed to cover a portion of the second piezoelectric film 138, the fourth electrode layer 168, and the third electrode layer 166. For example, the second protective film 154 and the support layer 150 may cover a side portion of each layer. In other words, the second protective film 154 and the support layer 150 may cover a side portion of the actuator 130. The second protective film 154 and the support layer 150 may cover the support layer 150 side of the actuator 130.

The first protective film 152 and the second protective film 154 may be formed of silicon oxide or silicon nitride. The first protective film 152 and the second protective film 154 may be formed of a similar type of insulating material as the support layer 150, and are preferably formed of substantially the same insulating material as the support layer 150. In other words, the first protective film 152 and the second protective film 154 are formed to be both elastic and rigid, to effectively seal with the support layer 150, and to have a strong connection, in the same manner as the support layer 150. In the present embodiment, the first protective film 152 and the second protective film 154 are formed of the same insulating material as the support layer 150, and the interfaces between these layers are not shown in FIG. 2.

The protruding section 156 is a tip portion of the actuator 130 that is the movable portion, and this is a portion of the support layer 150 on which the first piezoelectric film 136 and second piezoelectric film 138 are not provided. The second contact point section 132 may be provided on the protruding section 156. In this way, the second contact point 134 can be formed at a position distanced from the first electrode layer 162, the second electrode layer 164, the third electrode layer 166, and the fourth electrode layer 168, and can decrease the effect of the electrical signal supplied to each of the electrode layers.

The protruding section 156 can be arranged to distance the first electrode layer 162, the second electrode layer 164, the third electrode layer 166, and the fourth electrode layer 168 from the transmission line from the first signal line 120 to the second signal line 124, when the first contact points 122 and the second contact point 134 are in contact to achieve the ON state. In this way, the protruding section 156 can decrease the effect of noise, caused by electrical signals supplied to the electrode layers, on the coplanar transmission line.

The first electrode layer 162 and the second electrode layer 164 are respectively formed on the top and bottom surfaces of the first piezoelectric film 136, and apply the first drive voltage to the first piezoelectric film 136. The first drive voltage may be a prescribed voltage that is positive or negative.

The first electrode layer 162 and the second electrode layer 164 may each be flat and extend in the length direction L of the actuator 130. The first electrode layer 162 and the second electrode layer 164 may be made from metals that can be easily machined with low resistance, such as aluminum, gold, platinum, copper, indium, tungsten, molybdenum, ruthenium, and iridium, oxide compound electrodes such as ruthenium oxide (RuO$_2$) and iridium oxide (IrO$_2$), ceramic electrodes, or semiconductors such as silicon.

If silicon is used as the electrode material, the silicon is preferably doped to have high impurity density. The first electrode layer 162 and the second electrode layer 164 of the present embodiment are each made of platinum. If platinum is deposited, the platinum may be deposited after depositing titanium, tantalum, or chrome, for example.

The third electrode layer 166 and the fourth electrode layer 168 are respectively formed on the top and bottom surfaces of the second piezoelectric film 138, and apply the second drive voltage to the second piezoelectric film. The second drive voltage may be a prescribed voltage that is positive or negative. The third electrode layer 166 and the fourth electrode layer 168 may each be flat and extend in the length direction L of the actuator 130. The third electrode layer 166 and the fourth electrode layer 168 may be made of the substantially same material as and have substantially the same shape as the first electrode layer 162 and the second electrode layer 164.

As another example, the third electrode layer 166 may be made of the substantially same material as and have substantially the same shape as the second electrode layer 164, and the fourth electrode layer 168 may be made of the substantially same material as and have substantially the same shape as the first electrode layer 162. The first electrode layer 162, the second electrode layer 164, the third electrode layer 166, and the fourth electrode layer 168 may each have a thickness in a range from 0.05 μm to 1 μm.

The first conductive oxide film 210 is formed between the first piezoelectric film 136 and the second electrode layer 164. The first conductive oxide film includes a conductive oxide. The main component included in the first conductive oxide film 210 may be an Ir-type oxide such as IrO$_2$, a Ru-type oxide such as RuO$_2$ or SRO, or oxides such as LSCO or LNO.

The first conductive oxide film 210 is formed on the first piezoelectric film 136 and decreases wear caused by the expansion and contraction of the first piezoelectric film 136. The repeated expansion and contraction of the first piezoelectric film 136 releases the oxygen contained in the piezoelectric film resulting in the accumulation of wear, and this is believed to decrease the lifespan of the piezoelectric film. Therefore, since the first conductive oxide film 210 includes oxide and contacts the first piezoelectric film 136, the first conductive oxide film 210 can prevent the release of oxygen from the first piezoelectric film 136.

Furthermore, the first conductive oxide film 210 can supply oxygen to a portion of the first piezoelectric film 136 from which oxygen has escaped. In this way, the first conductive oxide film 210 can prevent oxygen deficient regions from being formed in the first piezoelectric film 136, thereby increasing the lifespan of the first piezoelectric film 136.

The second conductive oxide film 220 is formed between the second piezoelectric film 138 and the fourth electrode layer 168. The second conductive oxide film 220 includes a conductive oxide. The main component included in the second conductive oxide film 220 may be an Ir-type oxide such as $IrO_2$, a Ru-type oxide such as $RuO_2$ or SRO, or oxides such as LSCO or LNO, and the second conductive oxide film 220 may be formed of the same material as the first conductive oxide film 210.

The second conductive oxide film 220 is formed on the second piezoelectric film 138 and decreases wear caused by the expansion and contraction of the second piezoelectric film 138. In other words, in the same manner as the first conductive oxide film 210, the second conductive oxide film 220 can prevent oxygen deficient regions from being formed in the second piezoelectric film 138, thereby increasing the lifespan of the second piezoelectric film 138.

The first power supply section 180 applies the first drive voltage to the first piezoelectric film 136. The first power supply section 180 receives a control signal from the control section 190, and applies a voltage corresponding to the control signal to the first piezoelectric film 136 as the first drive voltage. The second power supply section 182 applies the second drive voltage to the second piezoelectric film 138. The second power supply section 182 receives a control signal from the control section 190, and applies a voltage corresponding to the control signal to the second piezoelectric film 138 as the second drive voltage.

The reference voltage 184 supplies a predetermined voltage. In the present embodiment, the reference voltage 184 is a GND voltage of 0 V.

The control section 190 transmits a control signal to the first power supply section 180 and/or the second power supply section 182, to instruct whether a drive voltage for expanding or contracting the first piezoelectric film 136 and/or the second piezoelectric film 138 is to be applied or not. For example, when bringing the first contact point 122 and the second contact point 134 into contact with each other to turn ON the switching apparatus 100, the control section 190 transmits to the second power supply section 182 a control signal for contracting the second piezoelectric film 138 by applying the second drive voltage to the second piezoelectric film 138. When moving the first contact points 122 and the second contact point 134 away from each other to turn OFF the switching apparatus 100, the control section 190 transmits to the second power supply section 182 a control signal that stops the supply of the second drive voltage to the second piezoelectric film 138.

Instead, when bringing the first contact point 122 and the second contact point 134 into contact with each other to turn ON the switching apparatus 100, the control section 190 may transmit to the first power supply section 180 a control signal for expanding the first piezoelectric film 136 by applying the first drive voltage to the first piezoelectric film 136. When moving the first contact points 122 and the second contact point 134 away from each other to turn OFF the switching apparatus 100, the control section 190 may transmit to the first power supply section 180 a control signal that stops the supply of the first drive voltage to the first piezoelectric film 136.

As another example, when bringing the first contact points 122 and the second contact point 134 into contact with each other to turn ON the switching apparatus 100, the control section 190 may cause the first piezoelectric film 136 to expand by applying the first drive voltage to the first piezoelectric film 136 and cause the second piezoelectric film 138 to contract by applying the second drive voltage to the second piezoelectric film 138. When moving the first contact points 122 and the second contact point 134 away from each other to turn OFF the switching apparatus 100, the control section 190 may stop the supply of the drive voltages to the first piezoelectric film 136 and the second piezoelectric film 138.

As yet another example, when moving the first contact points 122 and the second contact point 134 away from each other to turn OFF the switching apparatus 100, the control section 190 may cause the first piezoelectric film 136 to contract in order to bias the actuator 130 in a return direction. Similarly, when turning OFF the switching apparatus 100, the control section 190 may cause the second piezoelectric film 138 to expand in order to bias the actuator 130 in the return direction.

The control section 190 may supply the first piezoelectric film 136 and the second piezoelectric film 138 respectively with predetermined values as the first drive voltage and the second drive voltage. The control section 190 may be hardware such as an electronic circuit, or may be software that operates according to a program, for example.

The cavity section 310 is provided on the lower substrate section 110 and forms a portion of the side walls of the switching apparatus 100 to cover the actuator 130 on four sides and house the actuator 130. The cavity section 310 may be formed of substantially the same material as the lower substrate section 110.

The base portion 320 is formed on the cavity section 310, and a portion of the base portion 320 is fixed to one end of the actuator 130 to create a fixed end of the actuator 130. By bonding the base portion 320 to the cavity section 310, the distance between the first contact points 122 and the second contact point 134 can be set to be less than or equal to the maximum displacement amount of the actuator 130. In other words, the height of the cavity section 310, which is the distance between the base portion 320 and the lower substrate section 110, can be adjusted to adjust the distance between the first contact points 122 and the second contact point 134.

The maximum displacement of the actuator 130 may refer to the displacement of the actuator 130 when the maximum drive voltage is applied to the first piezoelectric film 136 and/or the second piezoelectric film 138. The base portion 320 may be formed by etching a semiconductor material. For example, the base portion 320 may be formed from a silicon substrate. In this case, the base portion 320 may be bonded to the cavity section 310 using anodic bonding.

In this way, one end of the actuator 130 in the length direction L is supported by the base portion 320. When a voltage is applied to the first piezoelectric film 136 or the second piezoelectric film 138, the end of the actuator 130 on the second contact point section 132 side that is not supported by the base portion 320 bends in the thickness direction, which results in downward displacement or upward displacement in FIG. 2.

The upper substrate section 330 is provided on the base portion 320, and forms a lid of a package of the switching apparatus 100 formed by the lower substrate section 110, the cavity section 310, and the base portion 320. The upper substrate section 330 may be a substrate formed of glass, for example. In this case, the upper substrate section 330 may be bonded to the base portion 320 using anodic binding.

The present embodiment describes an example in which the base portion 320 fixes the actuator 130 to the upper substrate section 330, but instead, the actuator 130 may be fixed to the lower substrate section 110 or the cavity section 310.

The switching apparatus 100 of the present embodiment described above includes the first piezoelectric film 136 and the second piezoelectric film 138 having substantially the same thickness and located at substantially the same distance from a central plane in the thickness direction of the actuator 130, and therefore the stress causing the bowing generated by the first piezoelectric film 136 is substantially equal to the stress restricting the bowing generated by the second piezoelectric film 138. Furthermore, since the actuator 130 is formed of a plurality of films formed substantially symmetrically with respect to the central plane of the actuator 130 in the thickness direction, the residual stress, thermal stress, or the like due to the layering of a plurality of films that causes the actuator 130 to move in a direction resulting in bowing and the residual stress, thermal stress, or the like that causes the actuator 130 to move in a direction opposite the bowing are substantially the same, thereby restricting bowing of the actuator 130.

In this way, the actuator 130 can restrict bowing caused by thermal stress, and therefore the actuator 130 can achieve the switching operation in a variety of temperature environments. Furthermore, the actuator 130 includes the first conductive oxide film and the second conductive oxide film respectively on the top surfaces of the first piezoelectric film 136 and the second piezoelectric film 138, thereby increasing the lifespan of the piezoelectric films.

The present embodiment describes an example in which the actuator 130 includes the first conductive oxide film and the second conductive oxide film respectively on the top surfaces of the first piezoelectric film 136 and the second piezoelectric film 138. Instead, if the actuator 130 can include a structure with more layers, conductive oxide films may also be included on the bottom surfaces of the first piezoelectric film 136 and the second piezoelectric film 138.

The present embodiment describes an example in which the actuator 130 includes the first piezoelectric film 136 and the second piezoelectric film 138 having substantially the same thickness and located at substantially the same distance from the central plane of the actuator 130 in the thickness direction. Instead, the thickness of the second piezoelectric film 138 may be less than the thickness of the first piezoelectric film 136. For example, if the actuator 130 is formed by layering a plurality of films from the first piezoelectric film 136 side to the second piezoelectric film 138 side, a larger number of layers are formed in the first piezoelectric film 136 than in the second piezoelectric film 138, and therefore the stress generated by the first piezoelectric film 136 might differ from the stress generated by the second piezoelectric film 138.

Accordingly, even if the layers are formed of a plurality of materials having substantially same thickness and at substantially the same distance from the central plane of the actuator 130 in the thickness direction, the balance between the stresses generated by the different materials can cause bowing. Furthermore, there are cases where each layered material cannot be layered to have substantially same thickness and be at substantially the same distance from the central plane of the actuator 130 in the thickness direction, in which case the absolute values of the stresses above and below the support layer 150 are different and bowing occurs.

Therefore, by setting different thicknesses for the first piezoelectric film 136 and the second piezoelectric film, the absolute values of the stresses above and below the support layer 150 can be made substantially the same, thereby restricting bowing of the actuator 130. For example, in the actuator 130, the thickness of the second piezoelectric film 138 that is formed later can be less than the thickness of the first piezoelectric film 136 formed earlier.

The thickness ratio between the first piezoelectric film 136 and the second piezoelectric film 138 may be determined according to the amount of bowing exhibited by the actuator 130. The thickness ratio between the first piezoelectric film 136 and the second piezoelectric film 138 may be set in a range from 1:1 to 1:0.5, preferably in a range from 1:1 to 1:0.8.

In the actuator 130, the thickness of the second piezoelectric film 138 formed later may be set to be less than the thickness of the first piezoelectric film 136 formed earlier, according to the direction of the bowing. In this way, in the actuator 130, the thickness ratio between the first piezoelectric film 136 and the second piezoelectric film 138 can be adjusted such that the absolute values of the stresses above and below the support layer 150 become the same and cancel each other out, thereby restricting bowing.

The present embodiment describes an example in which the second contact point section 132 is provided on the protruding section 156. Instead, the second contact point section 132 may be provided below the fourth electrode layer 168 with a protective film interposed therebetween. In this case, the actuator 130 need not include the protruding section 156.

Figure 3:
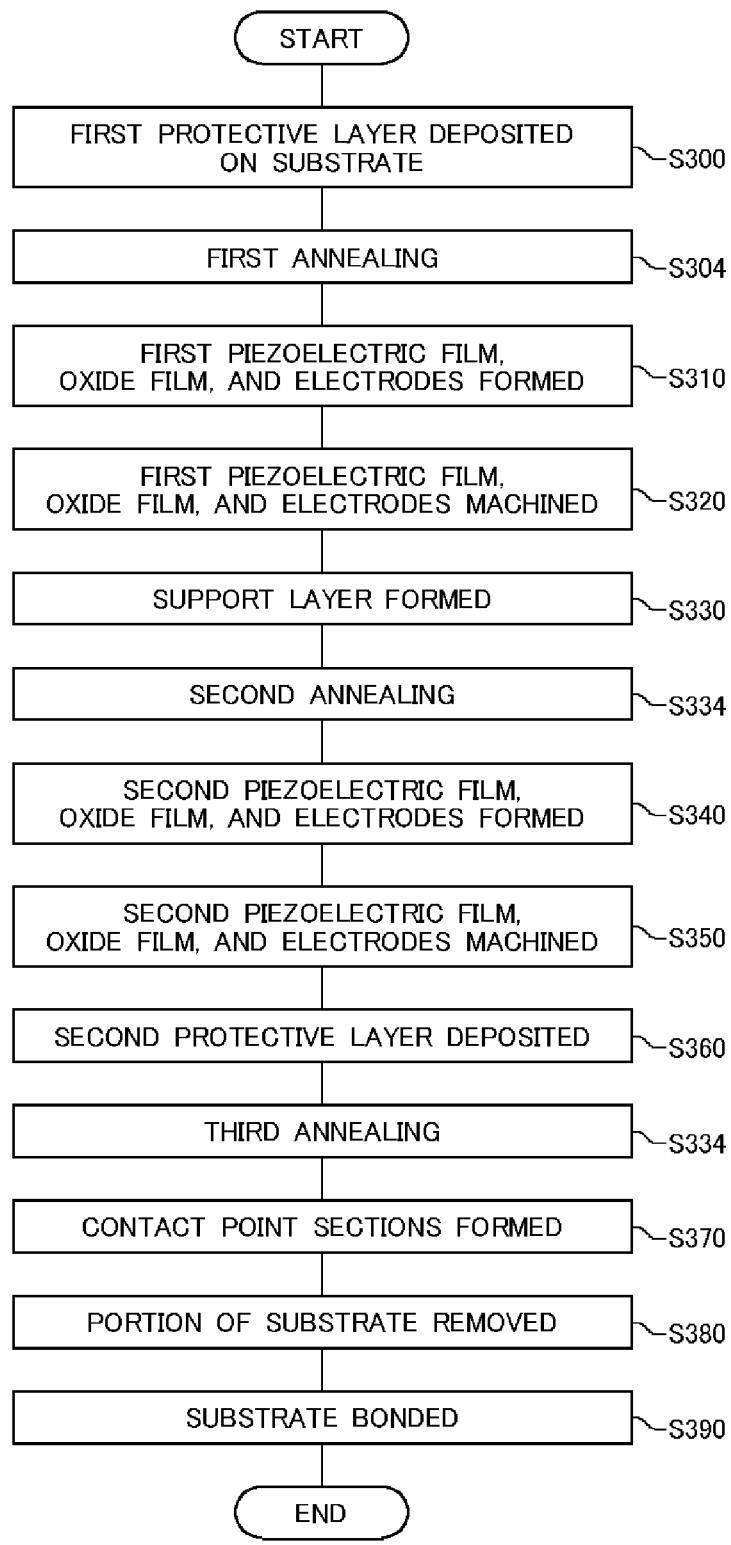
FIG. 3 shows an exemplary manufacturing method for forming the switching apparatus 100 according to the present embodiment.

FIG. 3 shows an exemplary manufacturing method for forming the switching apparatus 100 according to the present embodiment. FIGS. 4 to 16 show cross sections of the switching apparatus 100 at each stage in the process for forming the switching apparatus 100 according to the present embodiment.

First, the first protective film 152 is deposited using an insulating material on the substrate that will serve as the base portion 320 (S300). In the present embodiment, the substrate is a silicon substrate and the first protective film 152 is silicon oxide. The first protective film 152 may be formed by CVD. For example, the first protective film 152 of silicon oxide may be formed by TEOS (Tetra Ethyl Ortho Silicate), serving as the raw material, reacting with oxygen or ozone.

Figure 4:
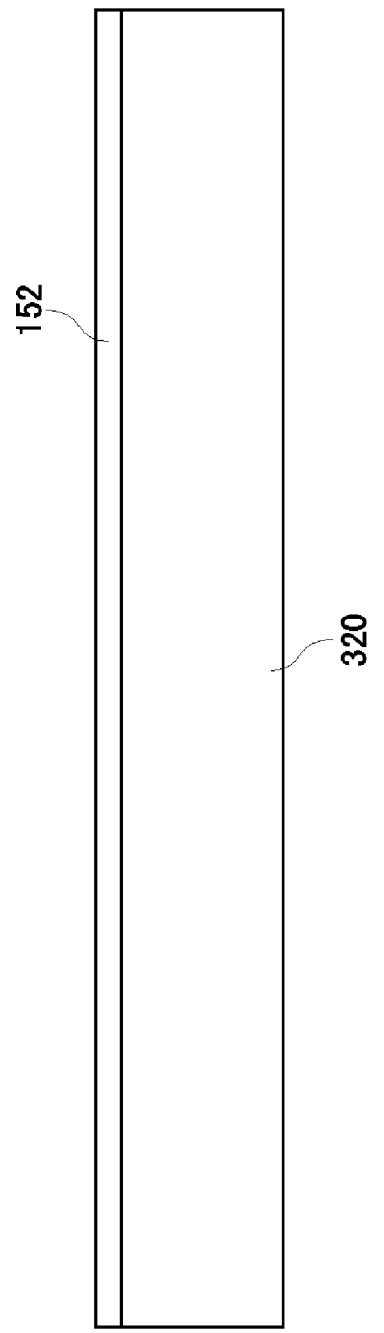
FIG. 4 shows a cross section of a stage at which the first protective film 152 is formed on the substrate that will serve as the base portion 320 according to the present embodiment.

Next, the first protective film 152 undergoes a first annealing (S304). The first protective film 152 is formed on the substrate as a result of the first annealing. FIG. 4 shows a cross section of a stage at which the first protective film 152 is formed on the substrate that will serve as the base portion 320 according to the present embodiment.

Next, the first electrode layer 162, the first piezoelectric film 136, the first conductive oxide film 210, and the second electrode layer 164 are formed on the first protective film 152 (S310). The first electrode layer 162 is deposited on the first protective film 152 using a conductive material. The first piezoelectric film 136 is deposited on the first electrode layer 162 via a sol-gel technique that involves applying sol-gel material on the first electrode layer 162 and then performing annealing. The sol-gel material may include PZT sol-gel liquid.

In the present embodiment, the first piezoelectric film 136 is a PZT film formed by applying a PZT sol-gel. The first conductive oxide film 210 is deposited on the first piezoelectric film 136 using a conducting oxide, and the second electrode layer 164 is deposited on the first conductive oxide film 210 using a conductive material. The first conductive oxide film 210 may be formed by depositing a conductive oxide film in which the main component is an Ir-type oxide such as $IrO_2$, a Ru-type oxide such as $RuO_2$ or SRO, or oxides such as LSCO or LNO.

Figure 5:
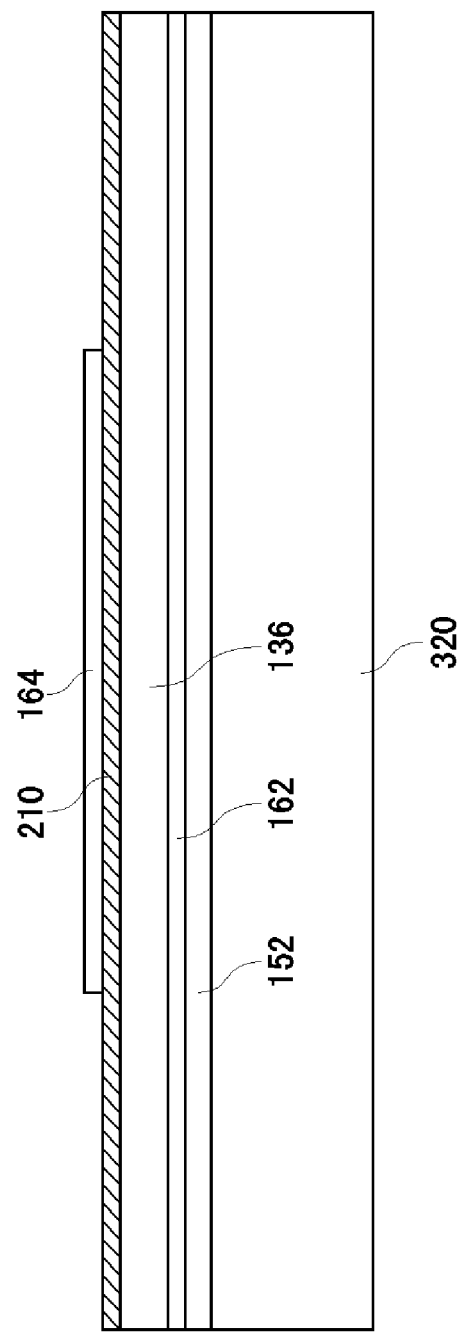
FIG. 5 shows a cross section of a stage at which the first electrode layer 162, the first piezoelectric film 136, the first conductive oxide film 210, and the second electrode layer 164 have been formed on the first protective film 152 according to the present embodiment.

The conductive material forming the first electrode layer 162 and the second electrode layer 164 may include platinum (Pt). The first electrode layer 162 and the second electrode layer 164 may be formed by vapor deposition or sputtering. FIG. 5 shows a cross section of a stage at which the first electrode layer 162, the first piezoelectric film 136, the first conductive oxide film 210, and the second electrode layer 164 have been formed on the first protective film 152 according to the present embodiment. The second electrode layer 164 may be formed to have a predetermined shape on the first piezoelectric film 136, using photolithography.

Here, the first electrode layer 162 may be formed at a predetermined growth temperature, such that the electrode material of the first electrode layer 162 has a preferred orientation in the <111> direction. As a result, the first piezoelectric film 136 deposited on the first electrode layer 162 has a preferred orientation in the <111> direction according to the orientation of the first electrode layer 162.

The piezoelectric films formed using PZT, for example, according to the present embodiment can have maximized piezoelectricity when the crystal axes of all of the crystals are oriented in the <001> direction. However, with these piezoelectric films, even if the growth temperature is adjusted such that the crystal axes are oriented in the <001> direction, the crystal axes of a portion of the crystals are oriented in the <010> or <100> direction. This portion of crystals does not exhibit piezoelectricity, and therefore it is difficult to increase the overall piezoelectricity of the piezoelectric films.

In contrast, since the piezoelectric films of the present embodiment are formed such that the crystal axes are oriented in the <111> direction, the orientations in directions such as <010> and <100> that do not exhibit piezoelectricity are prevented. Therefore, the first piezoelectric film 136 can reliably achieve higher piezoelectricity with better reproducibility than a piezoelectric film formed by adjusting the growth temperature to create a <001> orientation. Here, in order to orient the crystal axes in the <111> direction, PT liquid may be applied in advance prior to applying the PZT sol-gel.

Next, the first electrode layer 162, the first piezoelectric film 136, the first conductive oxide film 210, and the second electrode layer 164 are machined (S320). For example, the first electrode layer 162, the first piezoelectric film 136, the first conductive oxide film 210, and the second electrode layer 164 may be machined by being etched such that the surface area thereof is less that the surface area of the support layer 150 to be machined and formed later. The first protective film 152 may be used as an etch stop layer. If the second electrode layer 164 is formed having a predetermined shape, the first electrode layer 162, the first conductive oxide film 210, and the first piezoelectric film 136 may be machined to have substantially the same shape as the second electrode layer 164.

Figure 6:
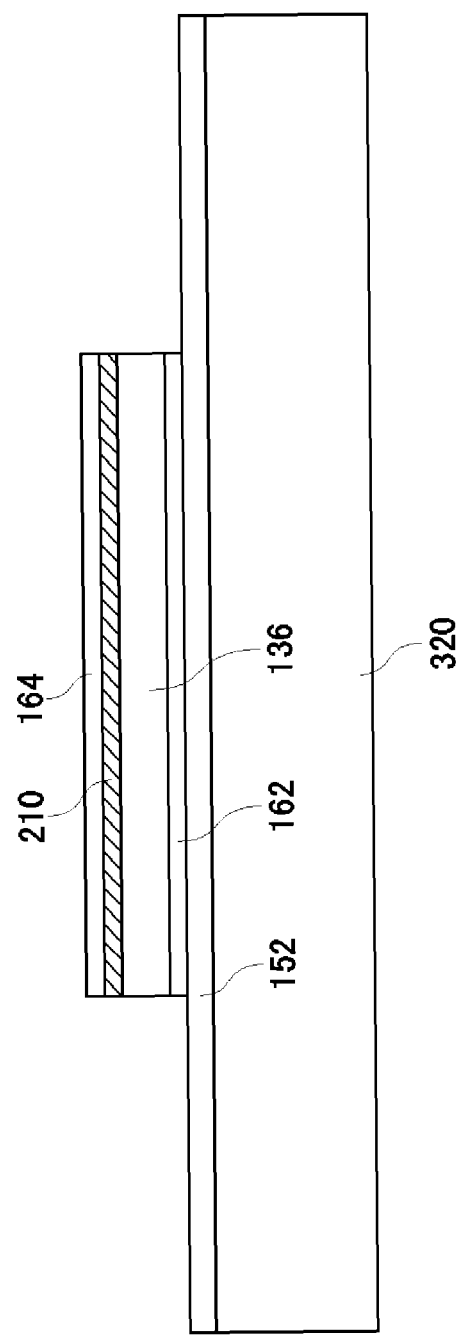
FIG. 6 shows a cross section of a stage at which the first electrode layer 162, the first piezoelectric film 136, the first conductive oxide film 210, and the second electrode layer 164 have been machined according to the present embodiment.

FIG. 6 shows a cross section of a stage at which the first electrode layer 162, the first piezoelectric film 136, the first conductive oxide film 210, and the second electrode layer 164 have been machined according to the present embodiment. The first piezoelectric film 136, the first conductive oxide film 210, and the second electrode layer 164 may be formed to expose, toward the top surface of the substrate, a connecting portion of the first electrode layer 162 to which the wiring sections 114 will later be connected.

Next, the support layer 150 is deposited on the second electrode layer 164 (S330). The support layer 150 may be deposited on the second electrode layer 164 using an insulating material. In the present embodiment, the support layer 150 is silicon oxide, and is formed to cover the first electrode layer 162, the first piezoelectric film 136, the first conductive oxide film 210, and the second electrode layer 164. The support layer 150 may be formed using CVD, in the same manner as the first protective film 152.

Next, the support layer 150 undergoes annealing (S334). As a result of the annealing, the support layer 150 is formed on the second electrode layer 164. The support layer 150 and the first protective film 152 are made of the same material, and therefore the first electrode layer 162, the first piezoelectric film 136, and the second electrode layer 164 are formed within the silicon oxide layer formed by the support layer 150 and the first protective film 152.

The first annealing and the annealing of the support layer are performed for a longer time and at a lower temperature gradient than the annealing for forming the first piezoelectric film 136. For example, the first annealing and the annealing of the support layer may be performed for 1 minute or more with a temperature gradient that is less than 10° C. per second. The first annealing and the annealing of the support layer are preferably performed for 10 minutes or more with a temperature gradient that is less than 1° C. per second.

The first annealing and the annealing of the support layer are more preferably performed for 30 minutes or more with a temperature gradient that is less than 0.33° C. per second. In this way, the first protective film 152 and the support layer 150 have impurities such as carbon (C), oxygen (O), and/or hydrogen (H) that were mixed in during the manufacturing process, for example, expelled therefrom, thereby forming an insulating film with high purity.

Next, the third electrode layer 166, the second piezoelectric film 138, the second conductive oxide film 220, and the fourth electrode layer 168 are formed on the support layer 150 (S340). The third electrode layer 166 is deposited on the support layer 150 using a conductive material. The second piezoelectric film 138 is deposited by applying sol-gel material on the third electrode layer 166 and then annealing. The second conductive oxide film 220 is deposited on the second piezoelectric film 138 using a conductive oxide, and the fourth electrode layer 168 is deposited on the second conductive oxide film 220 using a conductive material. The second conductive oxide film 220 is formed by depositing a conductive oxide film in which the main component is an Ir-type oxide such as $IrO_2$, a Ru-type oxide such as $RuO_2$ or SRO, or oxides such as LSCO or LNO.

Figure 7:
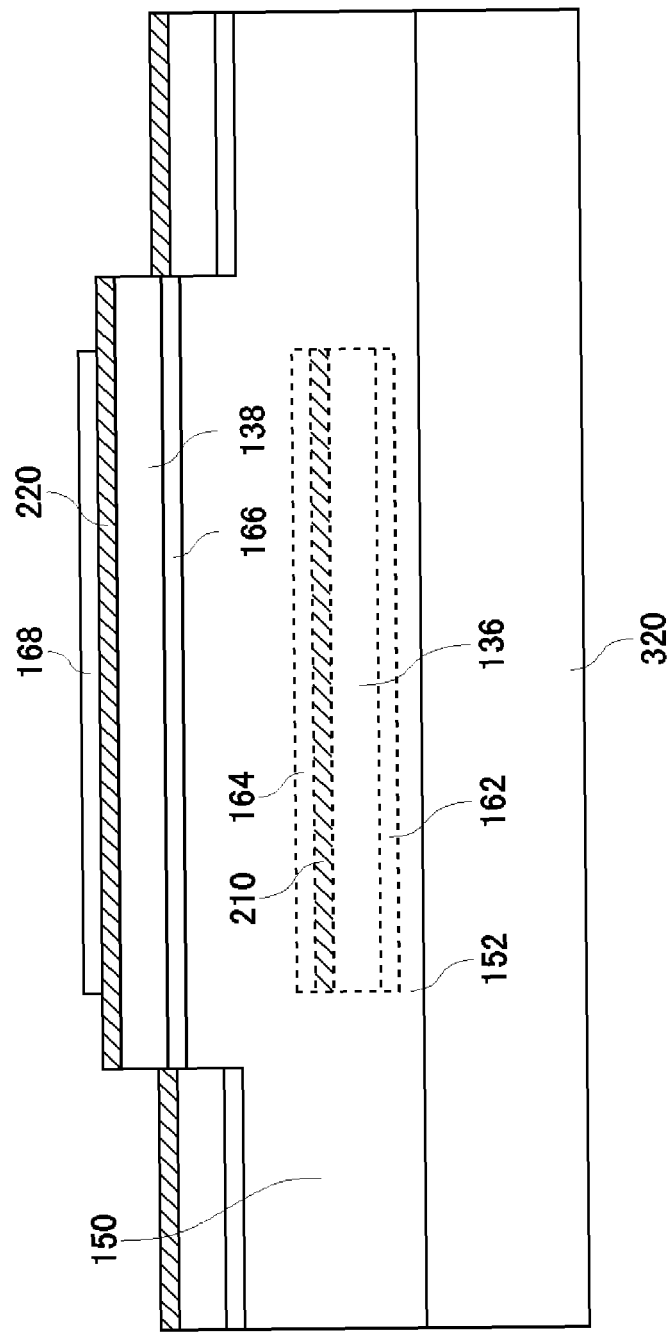
FIG. 7 shows a cross section of a stage at which the support layer 150, the third electrode layer 166, the second piezoelectric film 138, the second conductive oxide film 220, and the fourth electrode layer 168 are formed on the second electrode layer 164 according to the present embodiment.

The third electrode layer 166, the second piezoelectric film 138, the second conductive oxide film 220, and the fourth electrode layer 168 may be formed in the same manner as the first electrode layer 162, the first piezoelectric film 136, the first conductive oxide film 210 and the second electrode layer 164 formed on the first protective film 152 in step S310. FIG. 7 shows a cross section of a stage at which the support layer 150, the third electrode layer 166, the second piezoelectric film 138, the second conductive oxide film 220, and the fourth electrode layer 168 are formed on the second electrode layer 164 according to the present embodiment. Here, the fourth electrode layer 168 may be formed with a predetermined shape on the second piezoelectric film 138 using photolithography.

The third electrode layer 166 may be formed with a predetermined growth temperature, such that the electrode material of the third electrode layer 166 has a preferred orientation in the <111> direction. As a result, the second piezoelectric film 138 has a preferred orientation in the <111> direction according to the orientation of the third electrode layer, in the same manner as the first piezoelectric film 136. Therefore, the second piezoelectric film 138 has higher piezoelectricity than a piezoelectric film that is actually oriented in the <001> direction.

Figure 8:
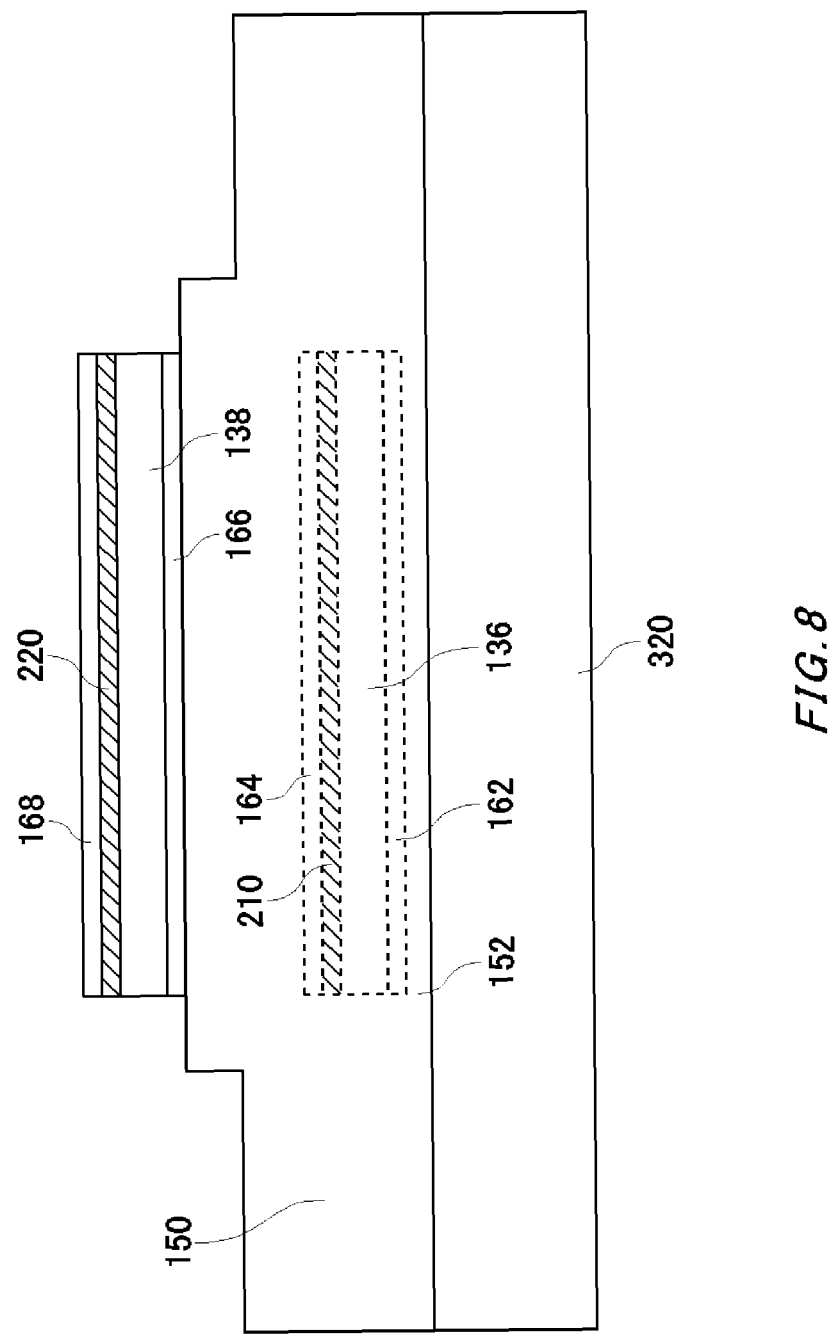
FIG. 8 shows a cross section of a stage at which the third electrode layer 166, the second piezoelectric film 138, the second conductive oxide film 220, and the fourth electrode layer 168 have been machined according to the present embodiment.

Next, the third electrode layer 166, the second piezoelectric film 138, the second conductive oxide film 220, and the fourth electrode layer 168 are machined (S350). The third electrode layer 166, the second piezoelectric film 138, the second conductive oxide film 220, and the fourth electrode layer 168 may be machined in the same manner as the first electrode layer 162, the first piezoelectric film 136, the first conductive oxide film 210, and the second electrode layer 164 machined in step S320. FIG. 8 shows a cross section of a stage at which the third electrode layer 166, the second piezoelectric film 138, the second conductive oxide film 220, and the fourth electrode layer 168 have been machined according to the present embodiment.

The third electrode layer 166, the second piezoelectric film 138, the second conductive oxide film 220, and the fourth electrode layer 168 may be machined to expose, toward the top surface of the substrate, connecting portions of the first electrode layer 162, the second electrode layer 164, and the third electrode layer 166 to which the wiring sections 114 will later be connected.

Figure 9:
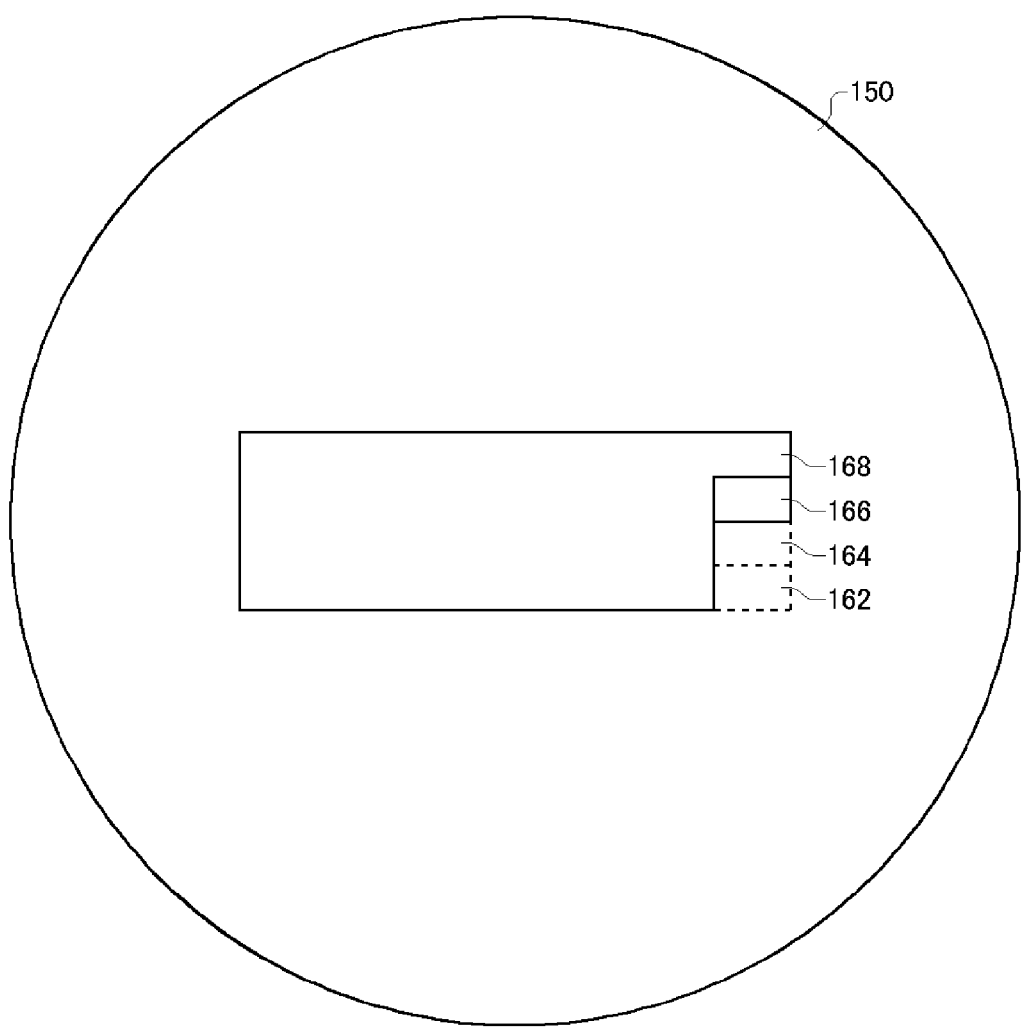
FIG. 9 is a top view of a stage at which the third electrode layer 166, the second piezoelectric film 138, the second conductive oxide film 220, and the fourth electrode layer 168 have been machined according to the present embodiment.

FIG. 9 is a top view of a stage at which the third electrode layer 166, the second piezoelectric film 138, the second conductive oxide film 220, and the fourth electrode layer 168 have been machined according to the present embodiment. FIG. 9 shows one actuator 130, made of a plurality of electrode layers and piezoelectric films, formed on the substrate. The diameter of the substrate used in this manufacturing may be 2 inches or more, in which case a plurality of actuators 130 are formed on the substrate. At this stage, portions of the first electrode layer 162, the second electrode layer 164, and the third electrode layer 166 are formed to be exposed from above, and these portions serve as the connecting portions to which the corresponding wiring sections 114 are to be connected.

Next, the second protective film 154 is deposited on the fourth electrode layer 168 using an insulating material (S360). In the present embodiment, the second protective film 154 is made of silicon oxide, and is formed to cover the fourth electrode layer 168, the second conductive oxide film 220, the second piezoelectric film 138, and the third electrode layer 166 together with the support layer 150. The second protective film 154 may be deposited using CVD, in the same manner as the support layer 150 and the first protective film 152.

Figure 10:
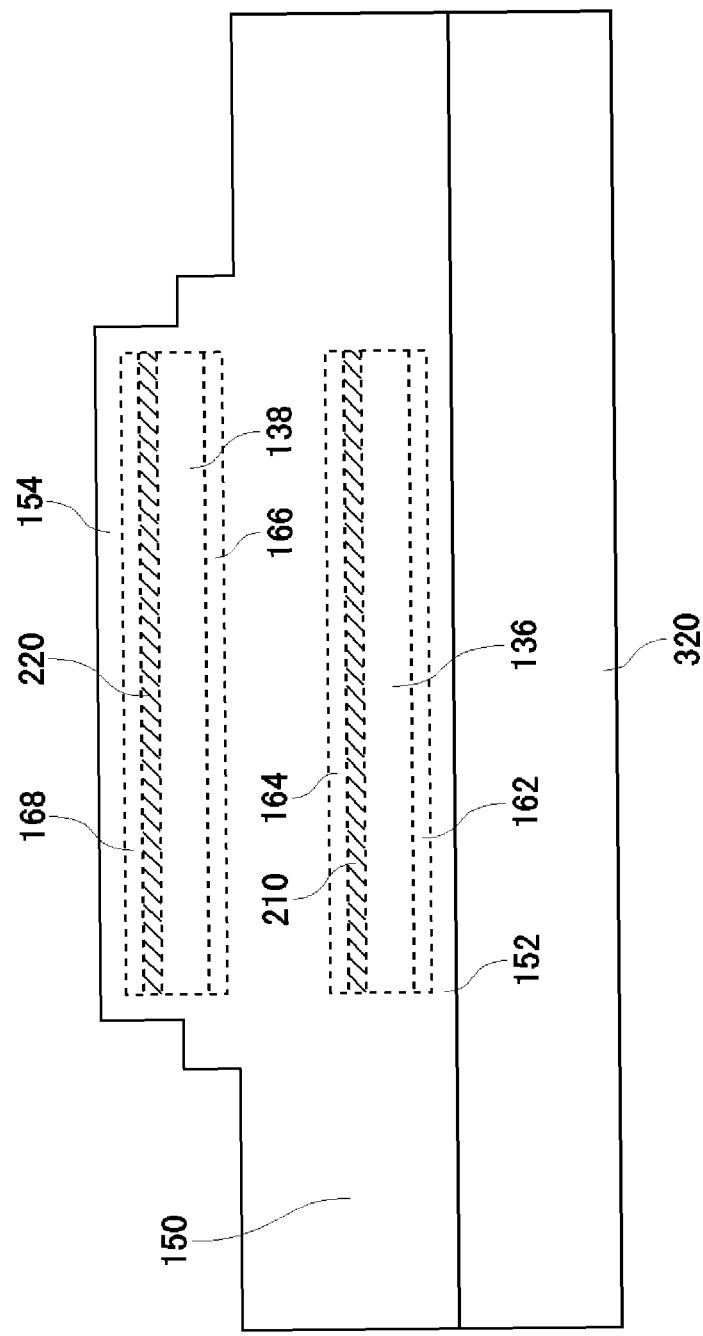
FIG. 10 shows a cross section of a stage at which the second protective film 154 has been formed on the fourth electrode layer 168 according to the present embodiment.

Next, the second protective film 154 undergoes annealing (S364). As a result of the annealing, the second protective film 154 is formed on the fourth electrode layer 168. The second protective film 154 and the support layer 150 are made of the same material, and therefore the fourth electrode layer 168, the second piezoelectric film 138, the second conductive oxide film 220, and the third electrode layer 166 are formed within the silicon oxide layer formed by the support layer 150 and the second protective film 154. FIG. 10 shows a cross section of a stage at which the second protective film 154 has been formed on the fourth electrode layer 168 according to the present embodiment.

The annealing may be performed for a longer time and at a lower temperature gradient than the annealing for forming the first piezoelectric film 136 or the second piezoelectric film 138. In this way, impurities that were mixed in during the manufacturing process, for example, can be expelled from the second protective film 154, in the same manner as the first protective film 152 and the support layer 150, thereby forming an insulating film with high purity.

Next, the support layer 150, the first protective film 152, and the second protective film 154 are machined. Here, the support layer 150, the second protective film 154, and the first protective film 152 are machined while covering the first piezoelectric film 136, the second piezoelectric film 138, the first electrode layer 162, the first conductive oxide film 210, the second electrode layer 164, the third electrode layer 166, the second conductive oxide film 220, and the fourth electrode layer 168, to achieve the shape of the actuator 130.

Furthermore, the support layer 150, the first protective film 152, and the second protective film 154 are formed such that the protruding section 156, on which the second piezoelectric film 138 and the first piezoelectric film 136 are not provided, remains at a tip portion at the movable end of the actuator 130. The support layer 150, the first protective film 152, and the second protective film 154 may be formed using etching.

Figure 11:
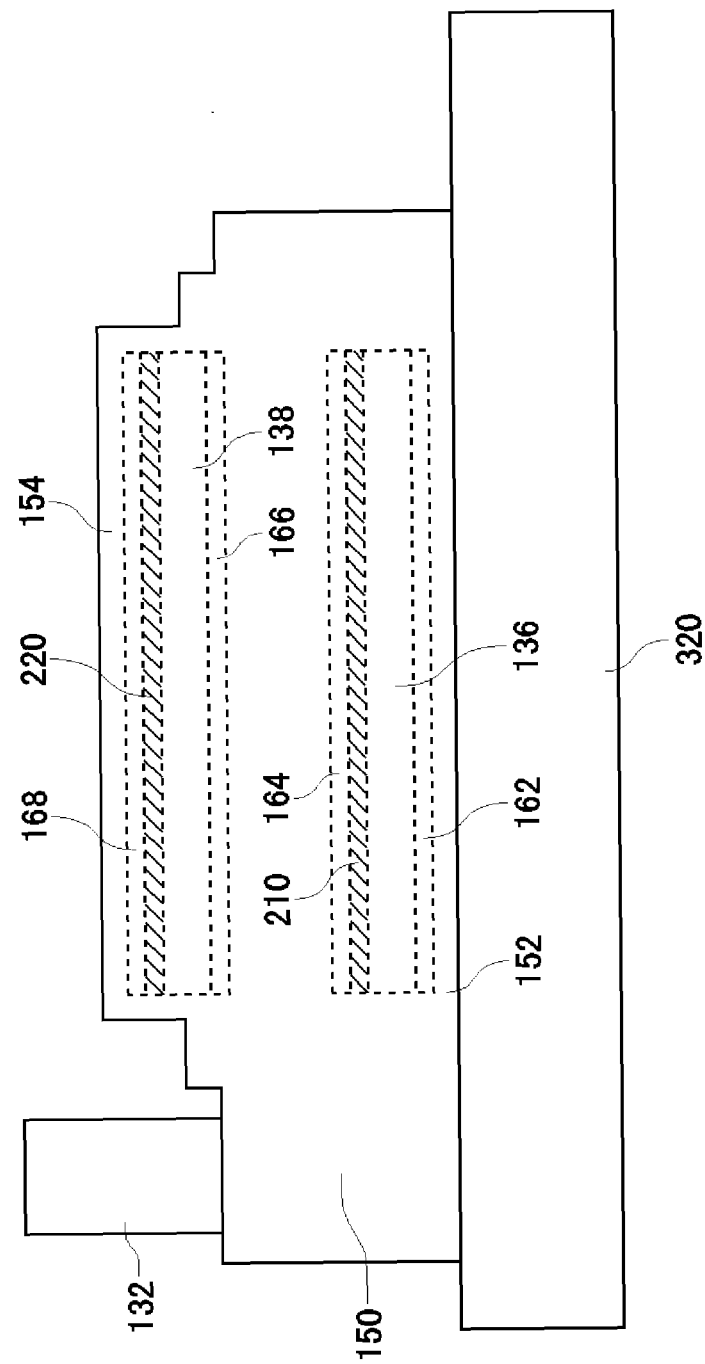
FIG. 11 shows a cross section of a stage at which the support layer 150, the first protective film 152, and the second protective film 154 have been machined and the second contact point section 132 has been formed according to the present embodiment.

Next, the second contact point section 132 is formed on the protruding section 156 (S370). FIG. 11 shows a cross section of a stage at which the support layer 150, the first protective film 152, and the second protective film 154 have been machined and the second contact point section 132 has been formed according to the present embodiment. Here, the support layer 150 and the second protective film 154 are formed to expose the connecting section of each electrode.

Figure 12:
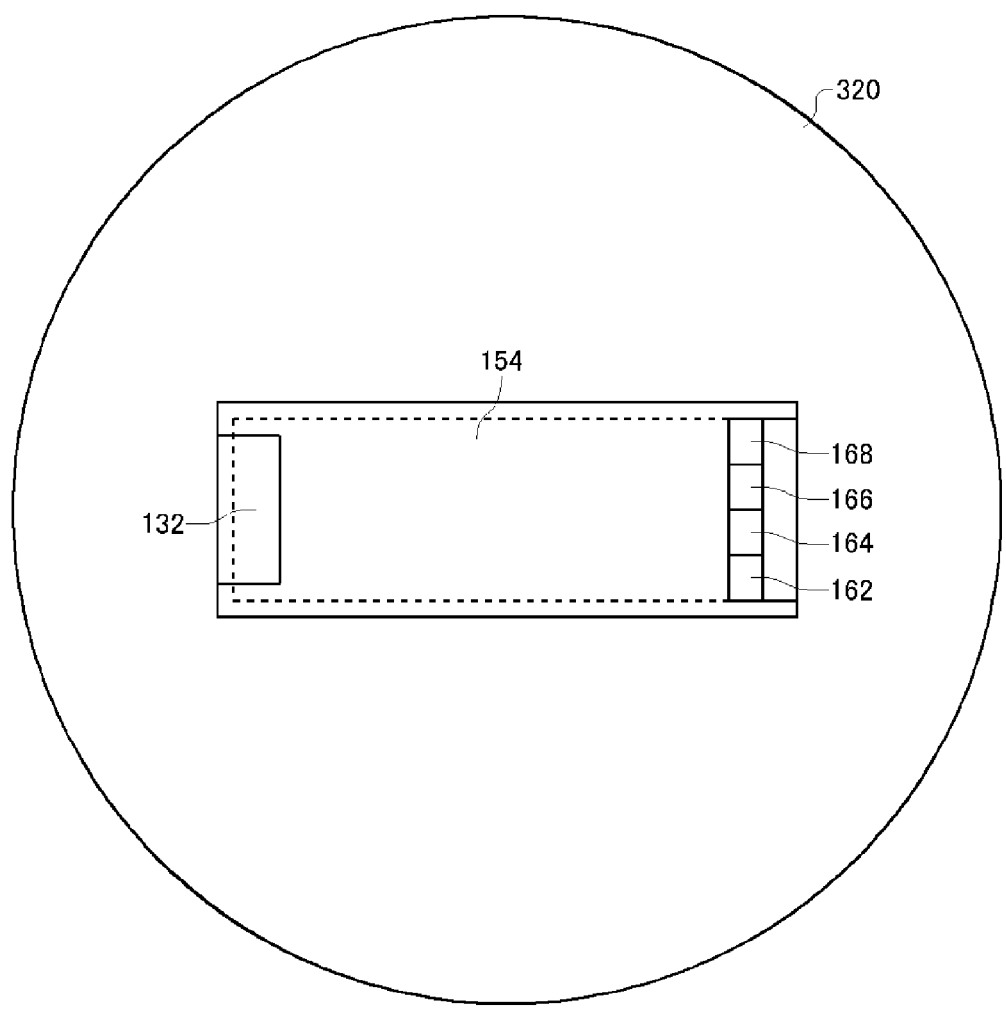
FIG. 12 is a top view of a stage at which the support layer 150, the first protective film 152, and the second protective film 154 have been machined and the second contact point section 132 has been formed according to the present embodiment.

FIG. 12 is a top view of a stage at which the support layer 150, the first protective film 152, and the second protective film 154 have been machined and the second contact point section 132 has been formed according to the present embodiment. At this stage, the support layer 150, the first protective film 152, and the second protective film 154 have been machined to have the surface shape of the actuator 130, and therefore the portion of the substrate that will serve as the base portion 320 is exposed. Furthermore, the connecting sections of the first electrode layer 162, the second electrode layer 164, the third electrode layer 166, and the fourth electrode layer 168 are exposed from above.

Figure 13:
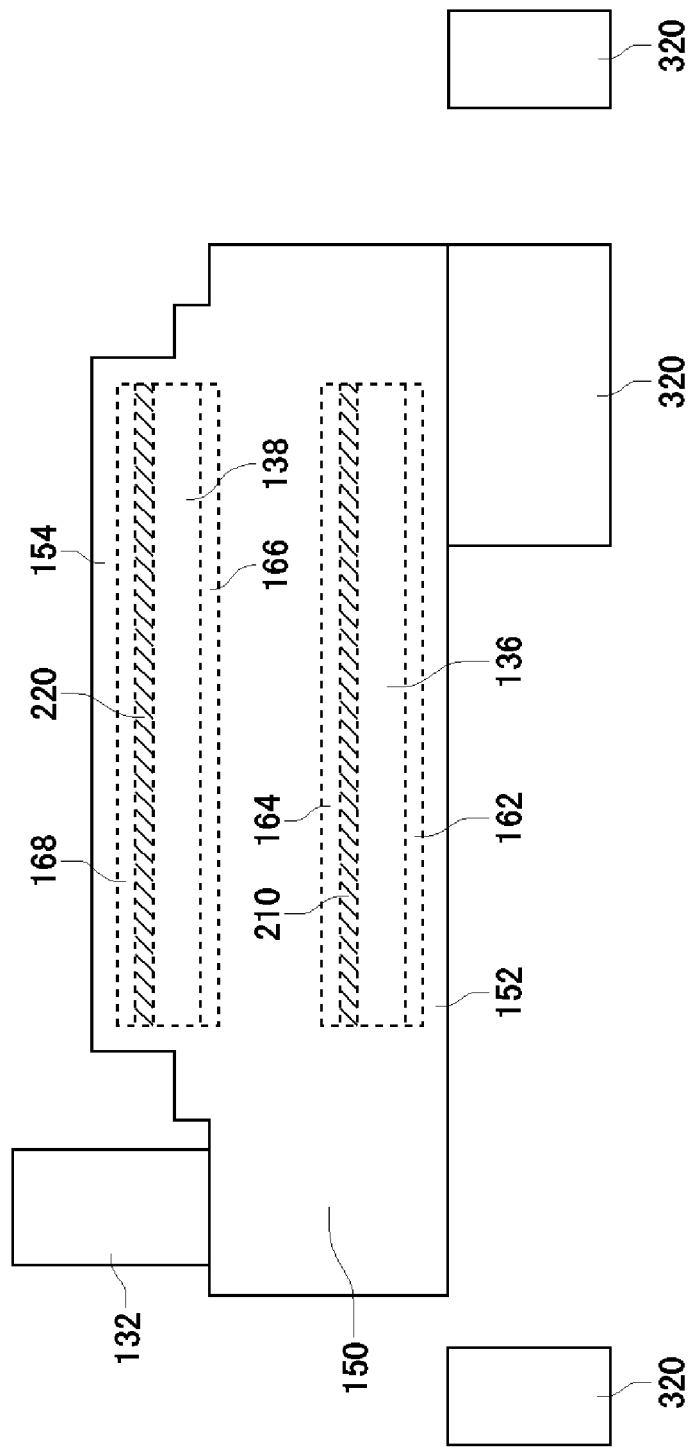
FIG. 13 shows a cross section of a stage at which the substrate has been machined to form the base portion 320 according to the present embodiment.

Next, the substrate is machined to form the base portion 320 (S380). The base portion 320 is formed by etching and removing a portion of the semiconductor substrate from a surface of the semiconductor substrate that is opposite the surface on which the actuator 130 is formed. Here, the base portion 320 may be etched using the first protective film 152 as the etching stop layer. At this stage, one end of the actuator 130 is separated from the substrate to serve as the movable end, and the other end is fixed to the base portion 320 to serve as the fixed end. FIG. 13 shows a cross section of a stage at which the substrate has been machined to form the base portion 320 according to the present embodiment.

Figure 14:
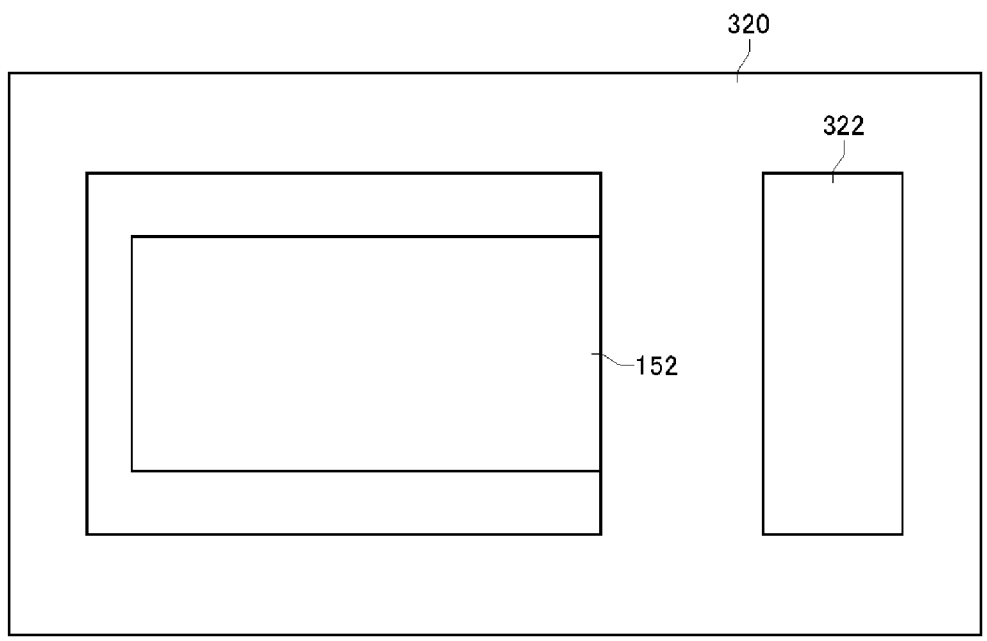
FIG. 14 is a bottom view of the base portion 320 at a stage at which the substrate has been machined to form the base portion 320 according to the present embodiment.

FIG. 14 is a bottom view of the base portion 320 at a stage at which the substrate has been machined to form the base portion 320 according to the present embodiment. In other words, FIG. 14 shows the actuator 130 as seen from the base portion 320 side. The first protective film 152 is exposed on the base portion 320 side of the actuator 130. The base portion 320 may include an aperture 322. The aperture 322 may be used to connect electrical wiring for exchanging electrical signals with the actuator 130.

Next, the base portion 320 is connected to the lower substrate section 110, the cavity section 310, and the upper substrate section 330 (S390). The lower substrate section 110, the cavity section 310, and the upper substrate section 330 of the present embodiment may each be formed of a glass substrate. The cavity section 310 and the upper substrate section 330 may be bonded to the base portion 320 using anodic bonding, in which bonding is achieved by applying heat while also applying voltage.

Figure 15:
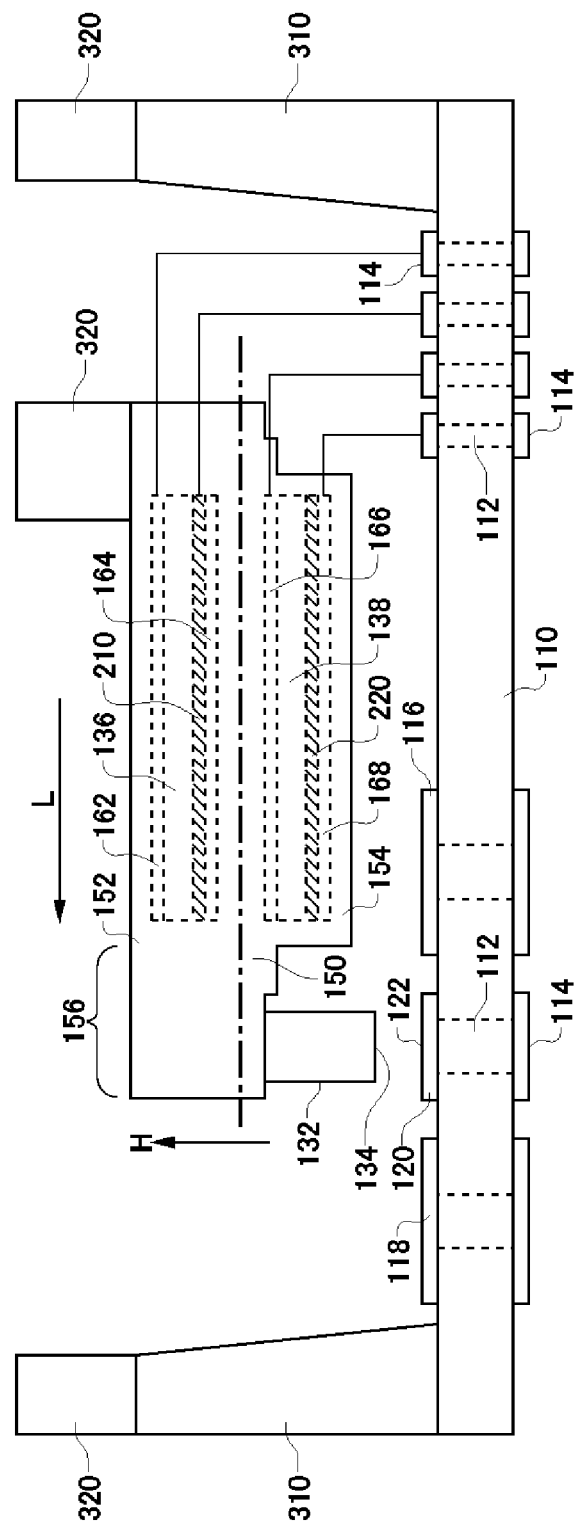
FIG. 15 shows a cross section of a stage at which the base portion 320 is connected to the lower substrate section 110 and the cavity section 310 according to the present embodiment.

FIG. 15 shows a cross section of a stage at which the base portion 320 is connected to the lower substrate section 110 and the cavity section 310 according to the present embodiment. The connecting sections of the first electrode layer 162, the second electrode layer 164, the third electrode layer 166, and the fourth electrode layer 168 may be connected to wiring sections 114 provided in the lower substrate section 110. The wiring sections 114 and the connecting sections may be connected to each other using pressure bonding. The connection operation may be performed through the aperture 322 of the base portion 320.

Figure 16:
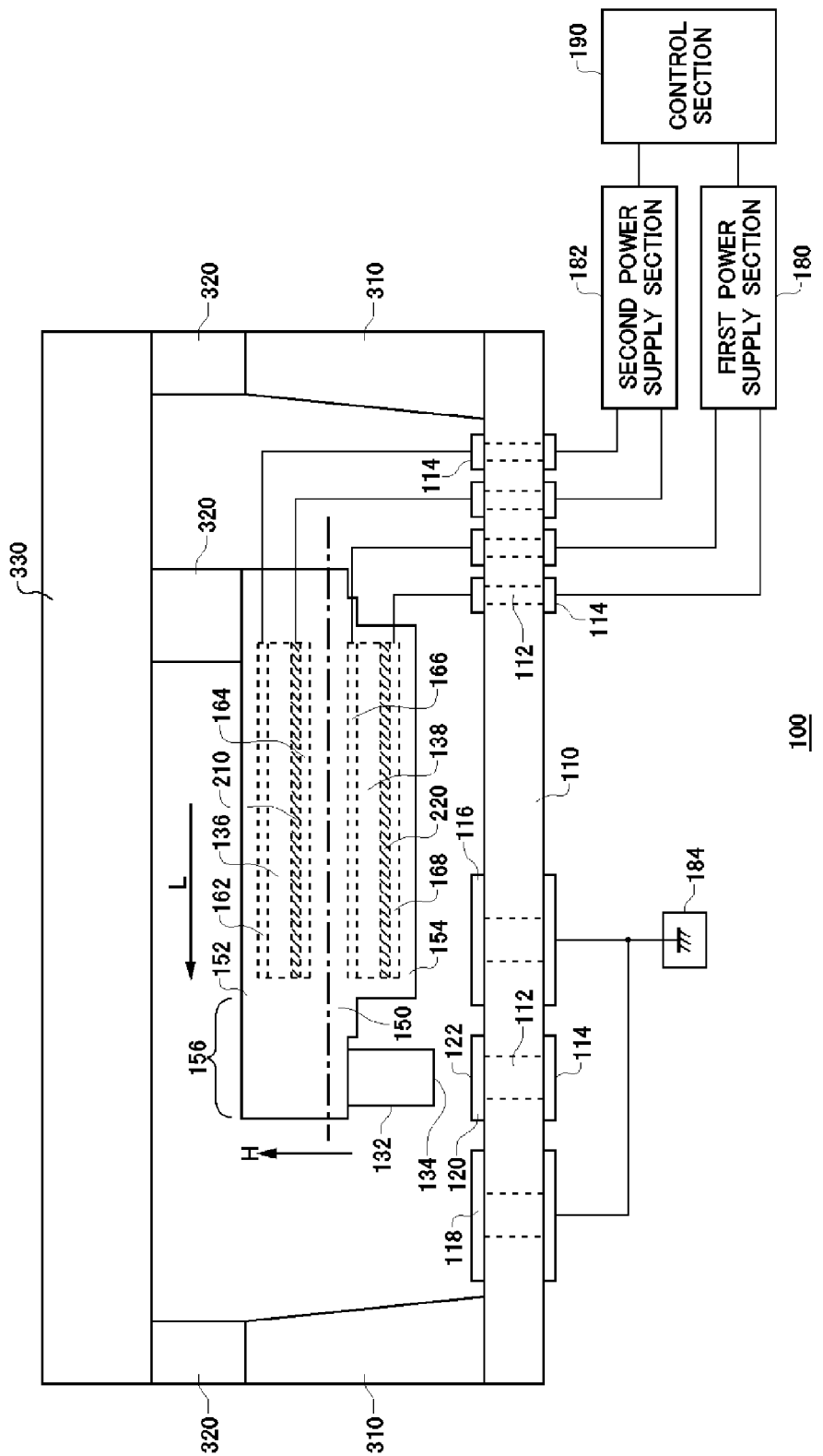
FIG. 16 shows a cross section of a stage at which the base portion 320 is connected to the upper substrate section 330 according to the present embodiment.

FIG. 16 shows a cross section of a stage at which the base portion 320 is connected to the upper substrate section 330 according to the present embodiment. In the switching apparatus 100 formed in this way, the actuator 130 is driven according to a control signal from the control section 190 provided outside the substrate, to bring the first contact point 122 and the second contact point 134 into contact with each other or move the first contact point 122 and the second contact point 134 away from each other.

In the manner described above, in the actuator 130 of the switching apparatus 100 according to the present embodiment, a first piezoelectric element layer including the first electrode layer 162, the first piezoelectric film 136, the first conductive oxide film 210, and the second electrode layer 164 is formed on the substrate serving as the base portion 320. Furthermore, in the actuator 130, the support layer 150 made of an insulator is formed on the first piezoelectric element layer, and a second piezoelectric element layer including the third electrode layer 166, the second piezoelectric film 138, the second conductive oxide film 220, and the fourth electrode layer 168 is formed on the support layer 150. Yet further, the actuator 130 is a bimorph actuator formed by removing a portion of the substrate that includes the first piezoelectric element layer, the support layer 150, and the second piezoelectric element layer.

Therefore, in the switching apparatus 100, the first piezoelectric film 136 is formed on the first electrode layer 162 with an orientation corresponding to that of the first electrode layer 162 and the first conductive oxide film 210 is then formed on the first piezoelectric film 136, thereby increasing the lifespan of the first piezoelectric film 136. Furthermore, in the switching apparatus 100, the second piezoelectric film 138 is formed on the third electrode layer 166 with an orientation corresponding to that of the third electrode layer 166 and the second conductive oxide film 220 is then formed on the second piezoelectric film 138, thereby increasing the lifespan of the second piezoelectric film 138.

Accordingly, at least one of the first piezoelectric film 136 and the second piezoelectric film 138 can form a rhombohedral crystal ferroelectric thin film having a Perovskite structure and a long lifespan. In other words, the switching apparatus 100 of the present embodiment includes an actuator that has a moveable range of approximately tens of μm. Furthermore, at least one of the first piezoelectric film 136 and the second piezoelectric film 138 can have a lattice constant matching that of whichever of the first electrode layer 162 and the third electrode layer 166 is adjacent thereto, and can contact this film in the surface direction with substantially the same average grain size.

The switching apparatus 100 of the present embodiment can include an actuator formed by wrapping the first piezoelectric film 136, the second piezoelectric film 138, the first electrode layer 162, the first conductive oxide film 210, the second electrode layer 164, the third electrode layer 166, the second conductive oxide film 220, and the fourth electrode layer 168 with the support layer 150 and with the first protective film 152 and second protective film 154 having substantially the same elasticity and rigidity as the support layer 150. As a result, the first protective film 152, the second protective film 154, and the support layer 150 can prevent physical damage such as cracking, chipping, and fracturing of each layer during manufacturing of the actuator 130 or when the actuator 130 bends.

The first protective film 152 and the second protective film 154 are rigid, and therefore the rigidity of the actuator 130 is increased. Therefore, the actuator 130 can prevent the contact points from sticking together.

The first protective film 152 and the second protective film 154 are formed of substantially the same material as the support layer 150, and can therefore have substantially the same rigidity and elasticity as the support layer 150. Accordingly, when the actuator 130 moves, the first protective film 152 and the second protective film 154 can restrict the occurrence of stress caused by a mismatch of rigidity and elasticity within the actuator 130.

The residual stress, thermal stress, or the like due to the layering of a plurality of films that causes the actuator 130 to move in a direction resulting in bowing and the residual stress, thermal stress, or the like that causes the actuator 130 to move in a direction opposite the bowing are caused to be substantially the same, thereby cancelling out these stresses and restricting bowing of the actuator 130. Furthermore, the first protective film 152, the second protective film 154, and the support layer 150 do not expose the second piezoelectric film 138, the first electrode layer 162, the second electrode layer 164, the third electrode layer 166, and the fourth electrode layer 168 to the outside, and therefore oxidation of these layers is prevented.

The present embodiment describes an example in which the switching apparatus 100 includes the actuator 130 having the first piezoelectric film 136 and the second piezoelectric film 138, but instead, the switching apparatus 100 may include an actuator 130 having three or more layered piezoelectric films. In this case, the actuator 130 may include a plurality of piezoelectric films and electrode layers formed on the first piezoelectric film 136 and/or the second piezoelectric film 138.

Instead, the switching apparatus 100 may include an actuator 130 having only one of the second piezoelectric film 138 and the first piezoelectric film 136. Here, if the actuator 130 includes the second piezoelectric film 138, instead of forming the first protective film 152 on the substrate serving as the base portion 320, the support layer 150 may be formed on this substrate. The support layer 150 uses the same insulating material as the first protective film 152, and can therefore be used as the etching stop layer when etching the base portion.

The present embodiment describes an example in which the switching apparatus 100 includes the actuator 130 having the first protective film 152 and the second protective film 154. Instead, if the physical damage such as cracking, chipping, and fracturing of each layer does not occur even if there are no protective films, the actuator 130 need not include the first protective film 152 and the second protective film 154.

Figure 17:
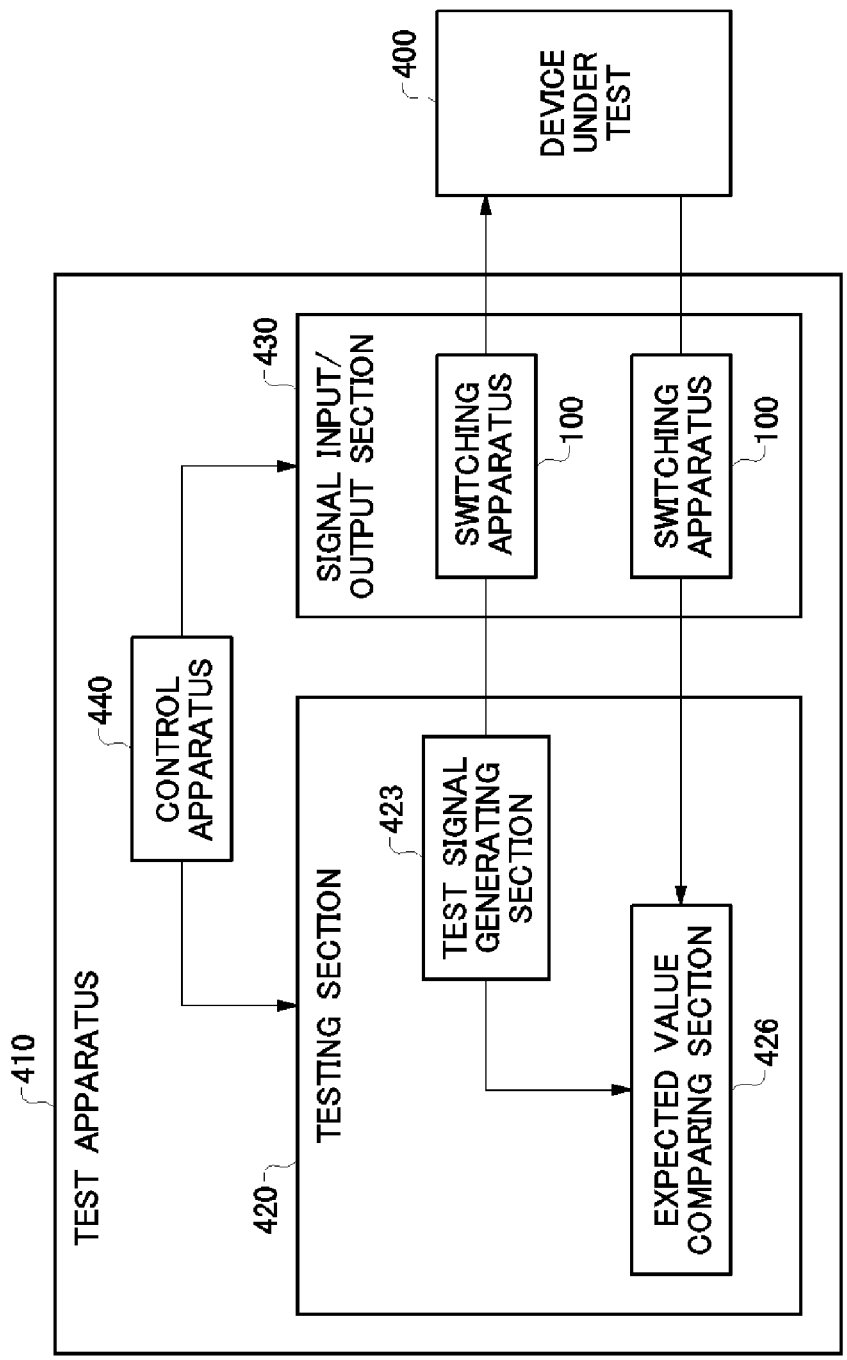
FIG. 17 shows an exemplary configuration of a test apparatus 410 according to the present embodiment, along with a device under test 400.

FIG. 17 shows an exemplary configuration of a test apparatus 410 according to the present embodiment, along with a device under test 400. The test apparatus 410 tests at least one device under test 400, which may be an analog circuit, a digital circuit, an analog/digital mixed circuit, a memory, or a system on chip (SOC), for example. The test apparatus 410 supplies the device under test 400 with a test signal based on a test pattern for testing the device under test 400, and judges pass/fail of the device under test 400 based on an output signal output by the device under test 400 in response to the test signal.

The test apparatus 410 includes a testing section 420, a signal input/output section 430, and a control apparatus 440. The testing section 420 tests the device under test 400 by exchanging electric signals with the device under test 400. The testing section 420 includes a test signal generating section 423 and an expected value comparing section 426.

The test signal generating section 423 is connected to one or more devices under test 400, via the signal input/output section 430, and generates a plurality of test signals to be supplied to the device under test 400. The test signal generating section 423 may generate expected values for the response signals output by the device under test 400 in response to the test signals.

The expected value comparing section 426 compares the data value included in the response signal of the device under test 400 received from the signal input/output section 430 to an expected value generated by the test signal generating section 423. The value comparing section 426 judges pass/fail of the device under test 400 based on the comparison result.

The signal input/output section 430 provides an electrical connection between the testing section 420 and the device under test 400 to be tested, and transmits test signals generated by the test signal generating section 423 to this device under test 400. The signal input/output section 430 receives response signals output by the device under test 400 in response to the test signals. The signal input/output section 430 transmits the received response signals of the device under test 400 to the expected value comparing section 426. The signal input/output section 430 may be a performance board mounted on a plurality of devices under test 400. The signal input/output section 430 includes the switching apparatus 100.

The switching apparatus 100 is provided between the testing section 420 and the device under test 400, and provides an electrical connection or disconnection between the testing section 420 and the device under test 400. The test apparatus 410 performs electrical connecting or disconnecting using the switching apparatus 100 according to the present embodiment.

The present embodiment describes an example in which the signal input/output section 430 is connected to one device under test 400, and one switching apparatus 100 is provided to each of the input signal line and the output signal line of the one device under test 400. Instead, the signal input/output section 430 may be connected to a plurality of devices under test 400, and one switching apparatus 100 may be provided to each input signal line and output signal line of each device under test 400. If there is one input/output signal line connecting the signal input/output section 430 to the device under test 400, one switching apparatus 100 may be provided to the one input/output line.

The control apparatus 440 transmits a control signal to the testing section 420 and the signal input/output section 430, to begin execution of the testing by the test apparatus 410. The control apparatus 440 transmits a control signal that causes the testing section 420 to perform a comparison between the test result and the expected value or to generate a test signal, for example, according to a test program. Furthermore, according to the test program, the control apparatus 440 transmits to the signal input/output section 430 instructions for connecting the switching apparatuses 100 provided to signal input/output lines to be connected and instructions for disconnecting the switching apparatuses 100 provided to signal input/output lines to be disconnected.

The test apparatus 410 according to the present embodiment described above can perform testing using a switching apparatus 100 that includes an actuator 130 that can prevent physical damage such as cracking, chipping, and fracturing while increasing rigidity. Furthermore, the test apparatus 410 can perform testing using a switching apparatus 100 with a longer lifespan and switching control with low power consumption by controlling the voltage. Yet further, the test apparatus 410 can perform testing using a switching apparatus 100 that decreases the occurrence of contact points sticking together.

Figure 18:
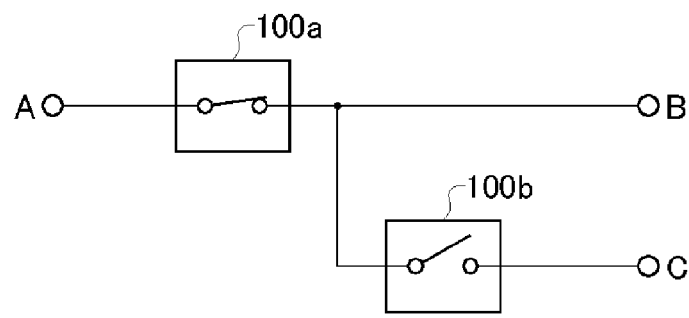
FIG. 18 shows an exemplary configuration of a transmission line switching apparatus 500 according to the present embodiment.

FIG. 18 shows an exemplary configuration of a transmission line switching apparatus 500 according to the present embodiment. The transmission line switching apparatus 500 includes a plurality of switching apparatuses 100 that are each connected between an input end and a corresponding one of a plurality of output ends. The transmission line switching apparatus 500 of the present embodiment includes a switching apparatus 100a and a switching apparatus 100b that are respectively between an input end A and output ends B and C.

The transmission line switching apparatus 500 electrically connects the input end A to the output end B and disconnects the input end A from the output end C, by turning ON the switching apparatus 100a and turning OFF the switching apparatus 100b. Furthermore, the transmission line switching apparatus 500 electrically disconnects the input end A from both the output end B and the output end C and electrically connects the output end B to the output end C, by turning OFF the switching apparatus 100a and turning ON the switching apparatus 100b.

In this way, the transmission line switching apparatus 500 can switch the transmission path between the input end and the plurality of output ends by turning the plurality of switching apparatuses ON and OFF. The transmission line switching apparatus 500 may be an apparatus in which a plurality of switching apparatuses are housed and sealed within one package, for example.

Figure 19:
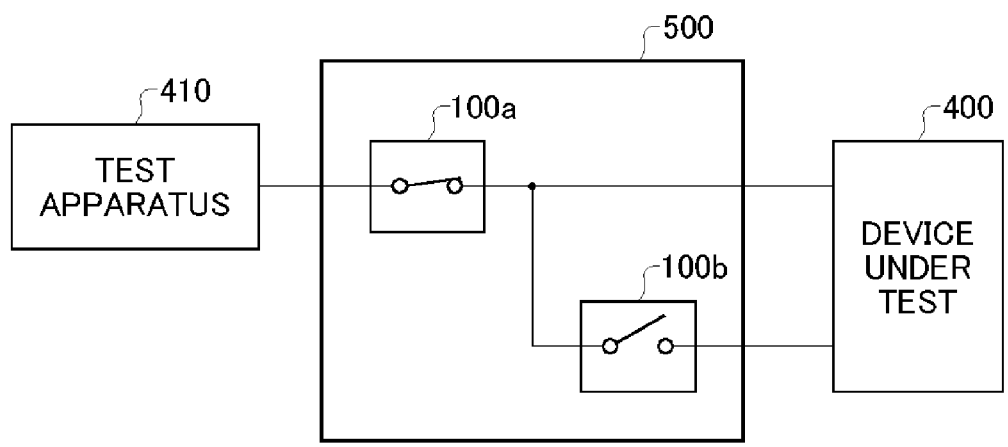
FIG. 19 shows an exemplary configuration of a test apparatus performing a loop-back test according to the present embodiment, along with the device under test 400.

FIG. 19 shows an exemplary configuration of a test apparatus performing a loop-back test according to the present embodiment, along with the device under test 400. The test apparatus performing the loop-back test of the present embodiment is formed by combining the test apparatus 410 described in FIG. 17 and the transmission line switching apparatus 500 described in FIG. 18. Therefore, components that are substantially the same as those of the test apparatus 410 or the transmission line switching apparatus 500 of the present embodiment described in FIGS. 17 and 18 are given the same reference numerals, and descriptions thereof are omitted.

When the supplying a test signal from the test apparatus 410 to the device under test 400, the test apparatus of the present embodiment turns ON the switching apparatus 100a of the transmission line switching apparatus 500 and turns OFF the switching apparatus 100b. Furthermore, when looping the signal output from the device under test 400 back to the device under test 400, the test apparatus of the present embodiment turns OFF the switching apparatus 100a of the transmission line switching apparatus 500 and turns ON the switching apparatus 100b.

In this way, the test apparatus of the present embodiment can switch between a transmission path by which a test signal for testing the device under test 400 is transmitted from the test apparatus 410 to the device under test 400 and a transmission path by which a signal from the device under test 400 is looped back and input to the device under test 400. The test apparatus performing the loop-back test of the present embodiment includes one transmission line switching apparatus 500 in the example described above, but instead, the test apparatus of the present embodiment may include two or more transmission line switching apparatuses 500. In this case, the test apparatus of the present embodiment may switch between testing of the device under test 400 using a test signal and the loop-back test, by switching among a plurality of transmission paths between the test apparatus 410 and the device under test 400.

The test apparatus for performing the loop-back test of the present embodiment described above can switch between testing with a test signal and a loop-back test, using switching apparatuses 100 that each include an actuator 130 that can prevent physical damage such as cracking, chipping, and fracturing while increasing rigidity. Furthermore, the test apparatus of the present embodiment switch between two types of testing using switching apparatuses 100 with a longer lifespan and switching control with low power consumption by controlling the voltage. Yet further, the test apparatus of the present embodiment can switch between two types of testing using switching apparatuses 100 that decrease the occurrence of contact points sticking together.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A method for manufacturing a bimorph actuator, comprising:
    forming a first piezoelectric element layer on a substrate;
    forming a support layer, which is insulating, on the first piezoelectric element layer;
    forming a second piezoelectric element layer on the support layer; and
    removing a portion of the substrate to form an actuator that includes the first piezoelectric element layer, the support layer, and the second piezoelectric element layer, such that the actuator has
    a movable end separated from the substrate yet operable to bend toward the substrate to contact an electrode of the substrate, and
    bend back away from the substrate to cease contact with the electrode, and
    a fixed end fixed to the substrate.

2. The method for manufacturing a bimorph actuator according to claim 1, wherein said forming a first piezoelectric element layer includes:
    depositing a first electrode layer, which is conductive, on the substrate;
    depositing a first piezoelectric film on the first electrode layer by applying a sol-gel material on the first electrode layer and performing annealing; and
    depositing a second electrode layer, which is conductive, on the first piezoelectric film.

3. The method for manufacturing a bimorph actuator according to claim 2, wherein
    said depositing a second electrode layer includes depositing a first conductive oxide film between the first piezoelectric film and the second electrode layer.

4. The method for manufacturing a bimorph actuator according to claim 3, wherein
    the sol-gel material includes PZT sol-gel liquid.

5. The method for manufacturing a bimorph actuator according to claim 4, wherein
    a main component of the conductive oxide film is an Ir-type oxide, a Ru-type oxide, or an oxide including LSCO or LNO.

6. The method for manufacturing a bimorph actuator according to claim 2, wherein said forming a second piezoelectric element layer includes:
    depositing a third electrode layer, which is conductive, on the support layer;
    depositing a second piezoelectric film on the third electrode layer by applying a sol-gel material on the third electrode layer and performing annealing; and
    depositing a fourth electrode layer, which is conductive, on the second piezoelectric film.

7. The method for manufacturing a bimorph actuator according to claim 6, wherein
    said depositing a fourth electrode layer includes depositing a second conductive oxide film between the second piezoelectric film and the fourth electrode layer.

8. The method for manufacturing a bimorph actuator according to claim 6, wherein
    said depositing a first electrode layer includes depositing the first electrode layer at a predetermined growth temperature such that the first electrode layer has a preferred orientation in a predetermined direction;
    said depositing a first piezoelectric film includes causing the first piezoelectric film to have a preferred orientation corresponding to the preferred orientation of the first electrode layer;
    said depositing a third electrode layer includes depositing the third electrode layer at a predetermined growth temperature such that the third electrode layer has a preferred orientation in a predetermined direction; and
    said depositing a second piezoelectric film includes causing the second piezoelectric film deposited on the third electrode layer to have a preferred orientation corresponding to the preferred orientation of the third electrode layer.

9. The method for manufacturing a bimorph actuator according to claim 6, wherein said forming a support layer includes:
    depositing the support layer on the second electrode layer; and
    annealing the deposited support layer.

10. The method for manufacturing a bimorph actuator according to claim 9, wherein
    a main component of the support layer is $SiO_2$ or SiN.

11. A method for manufacturing a bimorph actuator, comprising:
    depositing a first electrode layer, which is conductive, on a substrate;
    depositing a first piezoelectric film on the first electrode layer by applying a sol-gel material on the first electrode layer;

annealing the first piezoelectric film and the first electrode layer;

depositing a second electrode layer, which is conductive, on the first piezoelectric film;

depositing a support layer, which is insulating, on the second electrode layer;

annealing the deposited support layer;

depositing a third electrode layer, which is conductive, on the support layer;

depositing a second piezoelectric film on the third electrode layer by applying a sol-gel material on the third electrode layer and performing annealing;

depositing a fourth electrode layer, which is conductive, on the second piezoelectric film; and removing a portion of the substrate to form an actuator that includes the first piezoelectric element layer, the support layer, and the second piezoelectric element layer, wherein said forming a first piezoelectric element layer includes:
depositing a first protective film, which is insulating, between the substrate and the first electrode layer; and
annealing the first protective film, and said forming a second piezoelectric element layer includes:
depositing a second protective film, which is insulating, on the fourth electrode layer; and
annealing the second protective film.

12. The method for manufacturing a bimorph actuator according to claim 11, wherein said annealing the deposited support layer, said annealing the first protective film, and said annealing the second protective film have annealing times that are greater than or equal to an annealing time of the annealing performed during said depositing a first piezoelectric film, and have temperature gradients that are less than or equal to a temperature gradient used during the annealing performed during said depositing a first piezoelectric film.

* * * * *